US012800633B2

United States Patent

Kawahara et al.

(10) Patent No.: US 12,800,633 B2
(45) Date of Patent: Nov. 17, 2026

(54) SHUNT RESISTANCE MEASUREMENT CIRCUIT FOR SHUNT-BASED CURRENT SENSOR

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Shogo Kawahara, Nisshin (JP); Yoshikazu Furuta, Nisshin (JP); Tomohiro Nezuka, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 147 days.

(21) Appl. No.: 18/825,273

(22) Filed: Sep. 5, 2024

(65) Prior Publication Data

US 2025/0102550 A1 Mar. 27, 2025

(30) Foreign Application Priority Data

Sep. 27, 2023 (JP) ................................ 2023-166003

(51) Int. Cl.
*G01R 27/08* (2006.01)
*G01R 31/374* (2019.01)
(Continued)

(52) U.S. Cl.
CPC .......... *G01R 27/08* (2013.01); *G01R 31/374* (2019.01); *G01R 31/3835* (2019.01); *G01R 31/396* (2019.01)

(58) Field of Classification Search
CPC .... G01R 27/08; G01R 31/392; G01R 31/389; G01R 31/396; G01R 31/382;
(Continued)

(56) References Cited

U.S. PATENT DOCUMENTS 8,779,777 B2 7/2014 Irmer et al.
8,947,101 B2 2/2015 Engl
(Continued)

FOREIGN PATENT DOCUMENTS

EP 3 822 644 A1 5/2021
KR 20110113151 A * 10/2011 ........ H01M 10/4242

*Primary Examiner* — David M Schindler
(74) *Attorney, Agent, or Firm* — Posz Law Group, PLC

(57) ABSTRACT

A shunt resistance measurement circuit is adapted to a shunt-based current sensor configured to measure a resistance value of a shunt resistor. The shunt resistance measurement circuit includes a control circuit, a switching power supply circuit, a voltage measurement circuit, and a signal processing circuit. The control circuit outputs a control signal including an AC carrier signal. The switching power supply circuit is operated by the control signal to output a power supply to the shunt resistor. The voltage measurement circuit measures a voltage across the shunt resistor. The signal processing circuit measures the resistance value of the shunt resistor by executing signal processing, based on the voltage measured by the voltage measurement circuit.

14 Claims, 13 Drawing Sheets

(51) Int. Cl.
*G01R 31/3835* (2019.01)
*G01R 31/396* (2019.01)

(58) Field of Classification Search
CPC ............ G01R 31/3835; G01R 31/3842; G01R 31/385; G01R 31/386; G01R 31/387; G01R 31/388; G01R 31/374; G01R 1/203; G01R 19/0092; G01R 15/146; G01R 27/02; G01R 27/14
See application file for complete search history.

(56) References Cited

U.S. PATENT DOCUMENTS

| | | | | |
|---|---|---|---|---|
| 10,473,724 | B2 | 11/2019 | Aumer et al. | |
| 10,527,651 | B2 | 1/2020 | Wood et al. | |
| 2022/0357375 | A1* | 11/2022 | Angelini ............ | G01R 19/0092 |
| 2023/0054772 | A1* | 2/2023 | Nezuka ................ | G01R 15/146 |
| 2023/0055691 | A1* | 2/2023 | Nezuka ................ | G01R 15/246 |
| 2023/0059928 | A1* | 2/2023 | Nezuka ................ | G01R 35/005 |

* cited by examiner

SHUNT RESISTANCE MEASUREMENT CIRCUIT FOR SHUNT-BASED CURRENT SENSOR

CROSS REFERENCE TO RELATED APPLICATION

This application is based on Japanese Patent Application No. 2023-166003 filed on Sep. 27, 2023, the disclosure of which is incorporated herein by reference.

TECHNICAL FIELD

The present disclosure relates to a shunt resistance measurement circuit for a shunt-based current sensor.

BACKGROUND

Electric vehicles (EVs), hybrid electric vehicles (HEVs) and other electrically powered vehicles are equipped with a battery. To estimate the remaining charge of this type of battery, a circuit may be required to measure the current flowing through the battery. The shunt-based current sensor may be provided to measure the current flowing through the battery. In the shunt-based current sensor, a shunt resistor is connected to the battery in series. The shunt-based current sensor may measure the current by measuring a voltage across the shunt resistor.

SUMMARY

The present disclosure describes a shunt resistance measurement circuit for a shunt-based current sensor, and further describes that the shunt resistance measurement circuit includes a control circuit, a switching power supply circuit, a voltage measurement circuit, and a signal processing circuit.

DETAILED DESCRIPTION

Figure 1:
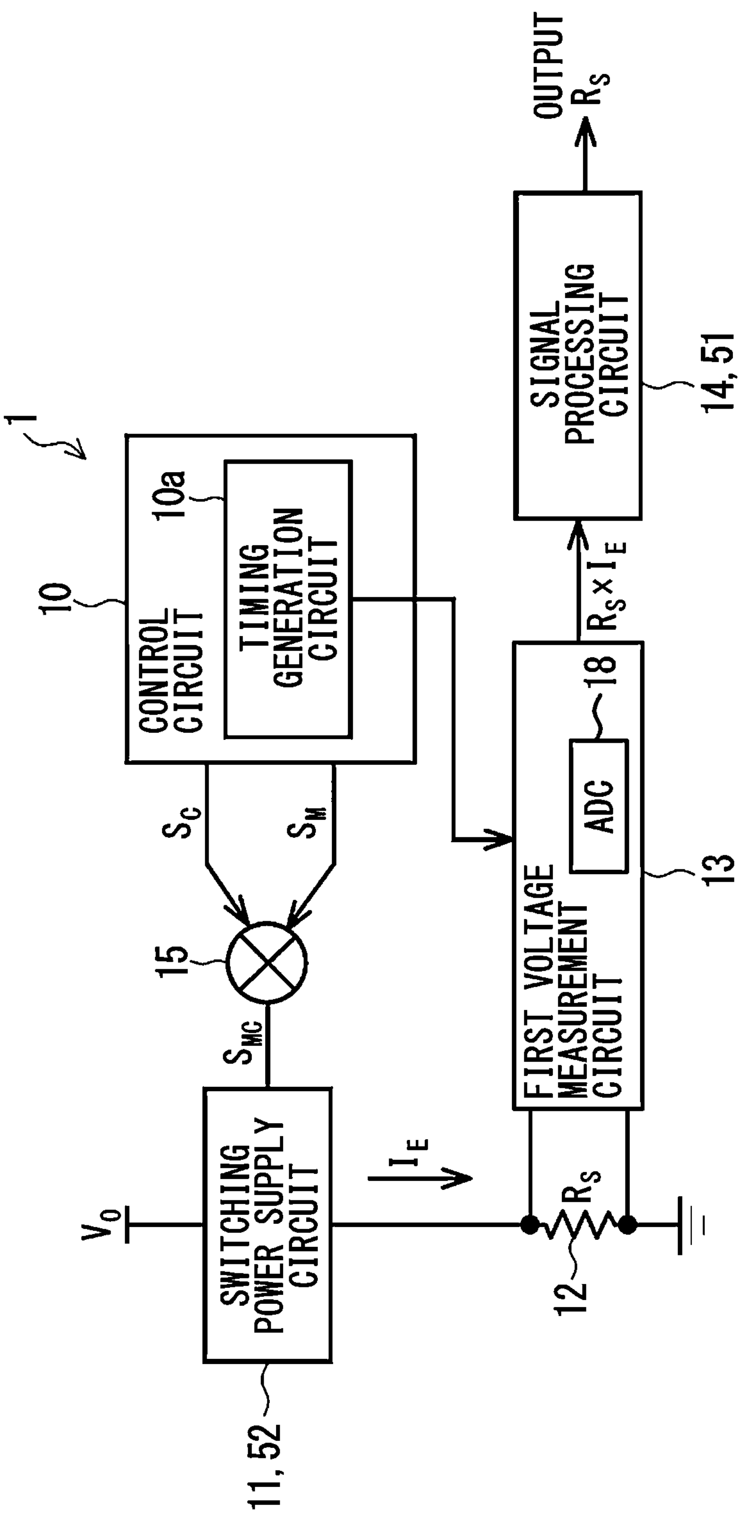
FIG. 1 is an electrical configuration diagram showing a shunt resistance measurement circuit according to a first embodiment.

A shunt resistor may change its resistance value over time due to degradation. Therefore, by accurately determining the resistance value of the shunt resistor and then correcting the value, the current may be measured with high accuracy. According to a shunt-based current sensor in a comparative example, a highly accurate reference excitation current is supplied to a shunt resistor, the voltage across the shunt resistor is measured. The shunt resistance value is calculated from the supplied excitation current and the measured voltage across the shunt resistor. Therefore, the shunt resistance value is corrected to improve accuracy.

When applying the technique in the comparative example, a reference current source that generates a highly accurate reference current is required. A reference current source with small temperature characteristics and small deterioration may not be desirable because the respective physical sizes of a reference diode, a transistor, and a correction circuit may increase. Thus, an increased cost may be anticipated. Furthermore, the power supply power for passing the excitation current tends to become larger, which may be undesirable.

A shunt resistance measurement circuit according to an aspect of the present disclosure is adapted to a shunt-based current sensor configured to measure a resistance value of a shunt resistor. The shunt resistance measurement circuit includes a control circuit, a switching power supply circuit, a voltage measurement circuit, and a signal processing circuit. The control circuit outputs a control signal including an AC carrier signal. The switching power supply circuit is operated by the control signal to output a power supply to the shunt resistor. The voltage measurement circuit measures a voltage across the shunt resistor. The signal processing circuit measures the resistance value of the shunt resistor by executing signal processing, based on the voltage measured by the voltage measurement circuit.

According to the above configuration, it is possible to measure the resistance value of the shunt resistor based on the AC excitation current generated by the switching power supply circuit. Therefore, there is no need to provide another current supply source for passing the current with higher accuracy.

The following describes several embodiments related to shunt resistance measurement circuits. In each of the embodiments described below, the same or similar reference numerals are attached to the same or similar configuration, and the description is omitted as necessary.

First Embodiment

Figure 2:
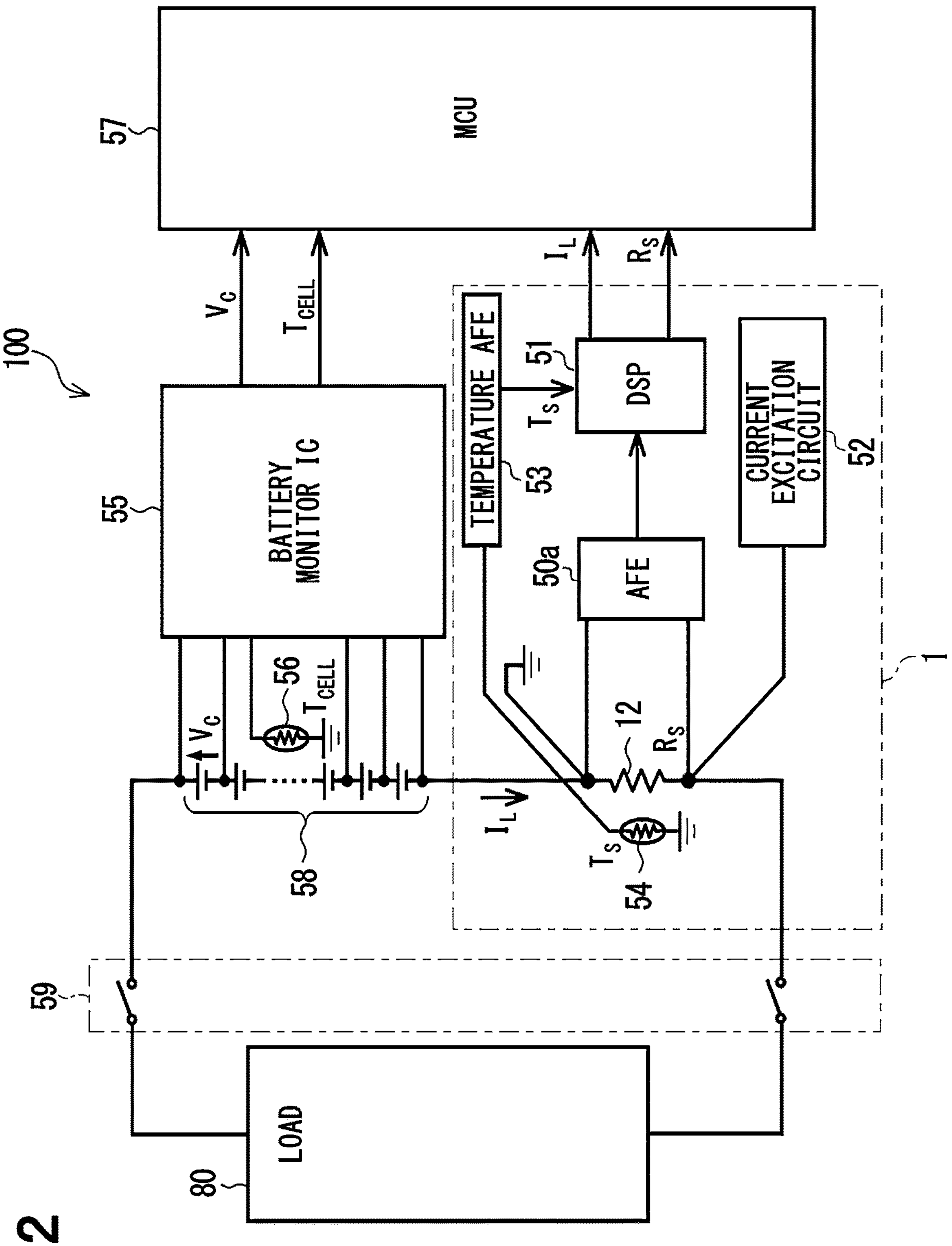
FIG. 2 is an electrical configuration block diagram schematically illustrating a battery monitoring system according to the first embodiment.

The following describes a first embodiment with reference to FIGS. 1 to 5. FIG. 2 shows a schematic diagram of a battery monitoring system 100. As shown in FIG. 2, the battery monitoring system 100 includes, for example, a battery monitoring integrated circuit 55, a temperature sensor 56, a microcontroller unit (MCU) 57, and a shunt resistance measurement circuit 1. The shunt resistance measurement circuit 1 includes an analog front end (AFE) 50*a*, a digital signal processor (DSP) 51, a current excitation circuit 52, and an analog front end (AFE) 53 for temperature measurement.

The MCU 57 includes a processor and a memory, and operates based on a program preliminarily stored in the memory. The memory is a non-transitory tangible storage medium. The current excitation circuit 52 includes, for example, a switching power supply circuit 11. The current excitation circuit 52 supplies an alternating current (AC) excitation current $I_E$ to the shunt resistor 12. The analog front end 50*a* is connected between the terminals of the shunt resistor 12. The analog front end 50*a* measures the voltage across the shunt resistor 12, and performs analog processing. The shunt resistor 12 is connected in series with a battery 58. The shunt resistor 12 is provided to measure a load current $I_L$ flowing through the battery 58 with high accuracy.

The battery 58 is a main battery and/or an auxiliary battery in which battery cells are combined in series or in series-parallel. The battery 58 is provided to drive a load 80 such as a main motor of a vehicle such as an electric vehicle or a hybrid vehicle, or a DC-DC converter, and/or to supply power to a vehicle electronic control device provided within the vehicle.

A relay 59 and the load 80 are connected in series to the battery 58 and the shunt resistor 12. When the ignition switch is turned on by a user to start the vehicle, the relay 59 is turned on. When the relay 59 is turned on, the load 80, the battery 58, and the shunt resistor 12 are connected. As a result, the load current $I_L$ flows through the shunt resistor 12.

The shunt resistor 12 has a resistance in the order of several tens of microohms. When the load current $I_L$ is supplied to the battery 58, a current in the order of several thousand amperes flows through the shunt resistor 12. The resistance value $R_S$ of the shunt resistor 12 changes due to deterioration over time. Therefore, the shunt resistance measurement circuit 1 can accurately measure the load current $I_L$ flowing through the battery 58 by accurately determining the resistance value $R_S$ of the shunt resistor 12 and then correcting for the influence of deterioration over time.

In addition, a temperature sensor 54 is disposed in the vicinity of the shunt resistor 12. The temperature sensor 54 is connected to the analog front end 53 for temperature measurement. The analog front end 53 for temperature measurement processes the temperature measurement signal $T_S$ provided from the temperature sensor 54, removes noise by waveform shaping, and outputs the temperature measurement signal $T_S$ to the DSP 51.

The DSP 51 corrects the load current $I_L$ flowing through the shunt resistor 12 and the resistance value $R_S$ of the shunt resistor 12 in accordance with the temperature measurement signal $T_S$, and outputs these values to the MCU 57. The DSP 51 functions as a signal processing circuit 14 shown in FIG. 1.

On the other hand, an integrated circuit 55 is connected to the battery 58 for monitoring the battery cells. The integrated circuit 55 monitors the voltage $V_C$ of each battery cell of the battery 58 and measures the remaining battery charge (SOC). The temperature sensor 56 is also located near the battery 58 and connected to the integrated circuit 55. When the integrated circuit 55 receives a temperature measurement signal $T_{CELL}$ from the temperature sensor 56, the integrated circuit 55 corrects the battery cell voltage $V_C$ in accordance with the temperature measurement signal $T_{CELL}$ and outputs the corrected voltage $V_C$ to the MCU 57. This enables the MCU 57 to monitor the state of each battery cell of the battery 58. The integrated circuit 55 may transmit a temperature measurement signal $T_{CELL}$ to the MCU 57, and the MCU 57 may correct the voltage $V_C$ of the battery cell in response to the temperature measurement signal $T_{CELL}$.

The MCU 57 receives information related to the load current $I_L$ and the resistance value $R_S$ of the shunt resistor 12 from the DSP 51. Therefore, the MCU 57 can accurately measure information related to the load current $I_L$ flowing through the battery cells included in the battery 58 according to the resistance value $R_S$.

The following describes the configuration block of the shunt resistance measurement circuit 1 with reference to FIG. 1. The shunt resistance measurement circuit 1 illustrated in FIG. 1 measures the resistance value $R_S$ of the shunt resistor 12. The shunt resistance measurement circuit 1 includes a control circuit 10, a switching power supply circuit 11, a voltage measurement circuit 13, a signal processing circuit 14 using the DSP 51, and a mixer 15, and is connected to the shunt resistor 12. When the shunt resistance measurement circuit 1 measures the resistance value $R_S$ of the shunt resistor 12, the control circuit 10 outputs the AC carrier signal $S_C$ and the AC modulation signal $S_M$ with the relay 59 turned off. For practical purposes, a driver circuit 11*a* is between the switching power supply circuit 11 and the mixer 15, but the driver circuit 11*a* is omitted from the drawings such as FIG. 1 which show the characteristic parts of the present disclosure in a block diagram.

The carrier signal $S_C$ is a square wave signal having a frequency $f_C$ of several hundred kHz, for example, about 100 kHz. Hereinafter, the reciprocal of the frequency $f_C$ is represented as a period $T_C$. The modulation signal $S_M$ is a signal having a frequency $f_M$ lower than that of the carrier signal $S_C$, and is, for example, a square wave signal of about several hundred Hz. Hereinafter, the reciprocal of the frequency $f_M$ is represented as the period $T_M$. The mixer 15 multiplies the carrier signal $S_C$ and the modulation signal $S_M$ to generate a modulated carrier signal $S_{MC}$, and outputs the modulated carrier signal $S_{MC}$ to the switching power supply circuit 11.

The modulated carrier signal $S_{MC}$ is used as a signal for driving the switching power supply circuit 11. The modulated carrier signal $S_{MC}$ is a signal in which a relatively high frequency carrier signal $S_C$ is superimposed on a relatively low frequency modulation signal $S_M$. In the present application, signals having the above relationship will be described as carrier signal $S_C$ and modulation signal $S_M$, but the names of carrier signal $S_C$ and modulation signal $S_M$ are not limited to these names.

Figure 3:
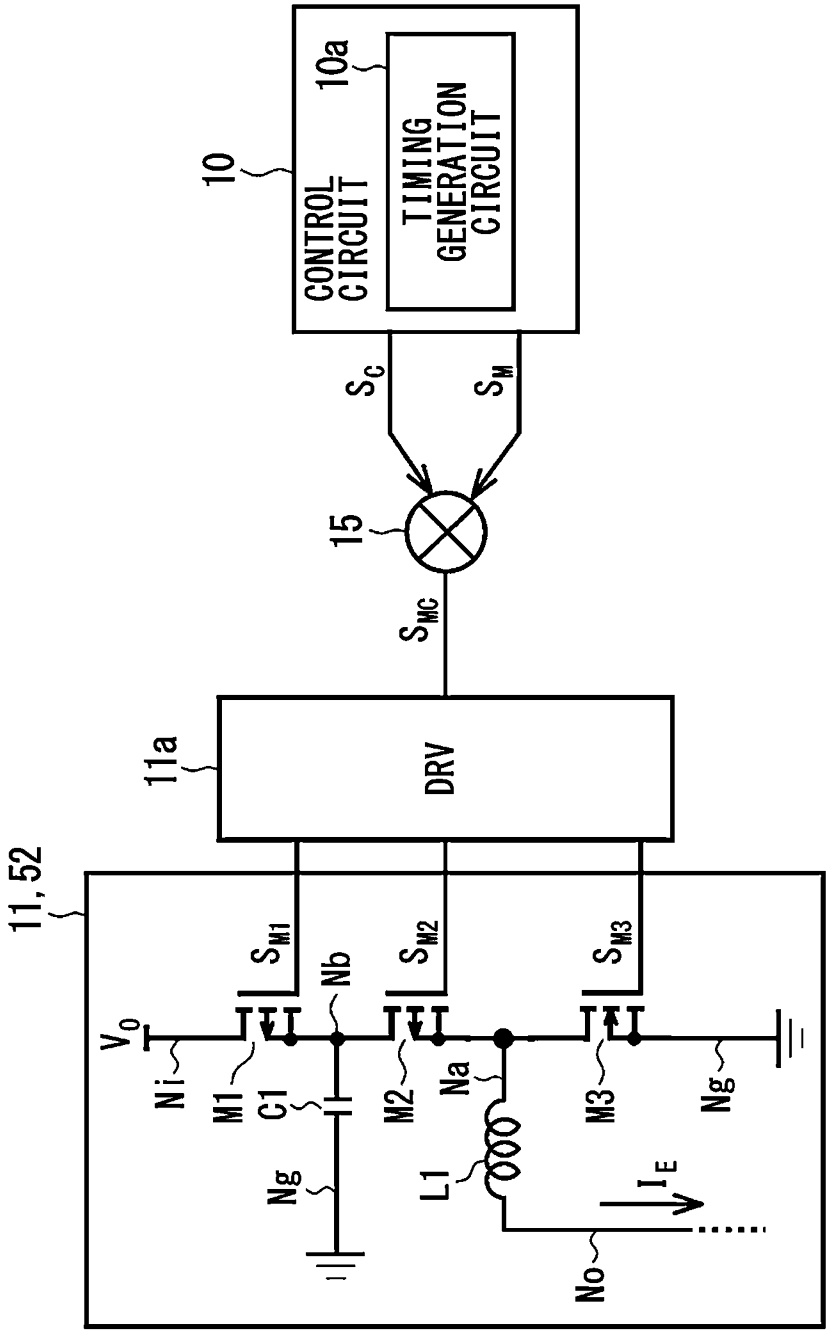
FIG. 3 is an electrical configuration diagram of a switching power supply circuit according to the first embodiment.

The switching power supply circuit 11 shown in FIG. 3 is driven via the driver circuit 11*a*, and drives switching elements M1 to M3 by providing drive signals $S_{M1}$, $S_{M2}$, and $S_{M3}$ from the driver circuit 11*a*, thereby outputting an AC excitation current $I_E$. The switching elements M1 and M2 are P-channel MOSFETs, and the switching element M3 is an N-channel MOSFET. FIG. 3 shows an example of the configuration of the switching power supply circuit 11, but the configuration of the switching power supply circuit 11 is not limited to this example.

The switching power supply circuit 11 illustrated in FIG. 3 is a synchronous rectification type switching power supply, and includes two serially connected switching elements M2 and M3 between the power supply node Ni of the power source $V_0$ and the ground node Ng. The switching power supply circuit 11 also includes an inductor L1 placed between the intermediate node Na of the two switching elements M2, M3 and the output node No of the switching power supply circuit 11. The power supply $V_0$ is generated by decreasing the power supply from the battery 58. Due to the impedance of the shunt resistor 12, which is on the order of several tens of microohms, the magnitude of the applied AC excitation current $I_E$ is approximately 1 ampere (A). Therefore, by providing the switching element M3 and using an element that satisfies the condition of a lower on-resistance as a configuration of a synchronous rectification type switching power supply, power supply output can be achieved under conditions of lower power consumption than in the case of diode rectification.

Furthermore, the switching power supply circuit 11 includes a charge sampling switching element M1 connected in series between the DC power supply node Ni and the upstream switching element M2. The switching power supply circuit 11 further includes a capacitor C1 disposed in a charge sampling stage between an intermediate node Nb and a ground node Ng. The intermediate node Nb is located between the upstream switching element M2 and the charge-sampling switching element M1.

Figure 4:
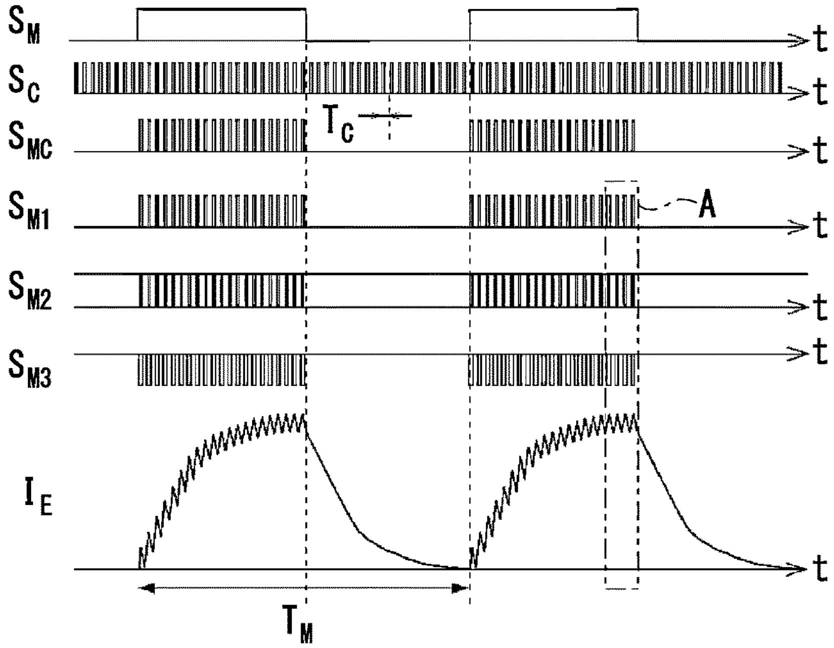
FIG. 4 is a time chart showing waveforms of various parts in the first embodiment.
Figure 5:
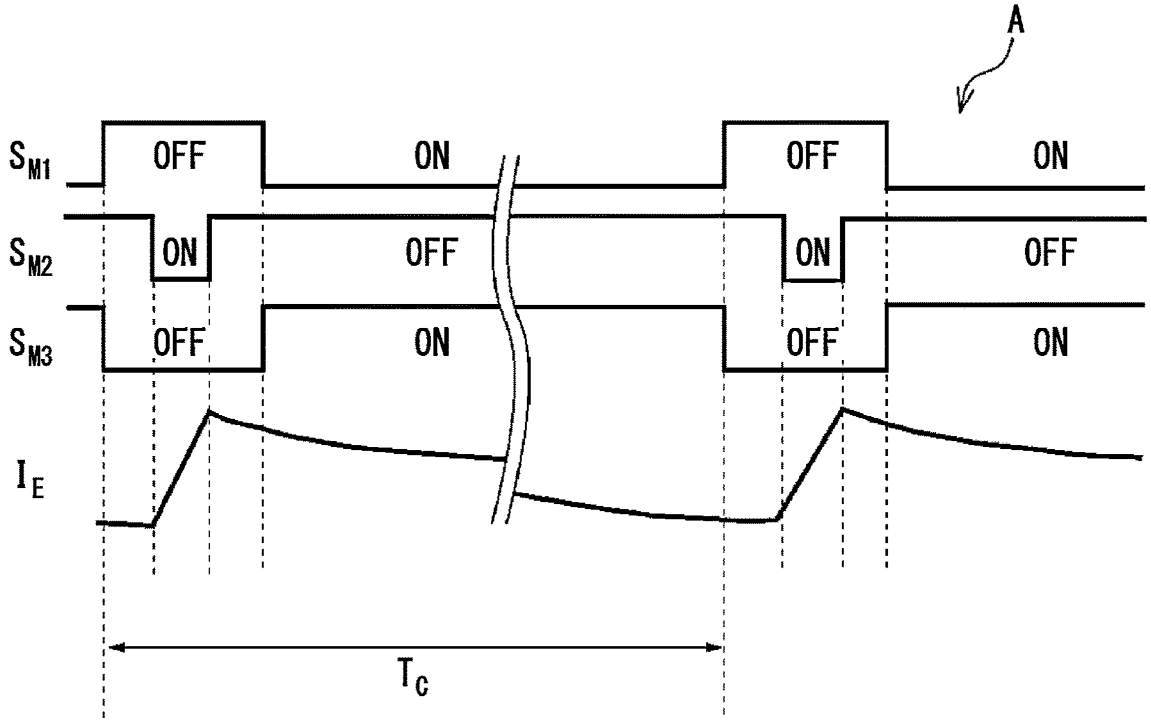
FIG. 5 is an enlarged view of a portion A in FIG. 4 according to the first embodiment.

FIG. 4 illustrates a timing chart of the AC excitation current $I_E$ output by the switching power supply circuit 11, and FIG. 5 illustrates an enlarged view of a part A thereof. When the driver circuit 11*a* receives the modulated carrier signal $S_{MC}$, the driver circuit 11*a* outputs a drive signal $S_{M1}$ that has a high voltage for a predetermined period of time from the generation timing of the carrier signal $S_C$, and at the same time outputs a drive signal $S_{M3}$ that has a voltage change complementary to the drive signal $S_{M1}$.

The drive signal $S_{M1}$ drives the gate of the switching element M1, which is the P-channel MOSFET. The drive signal $S_{M3}$ drives the gate of the switching element M3, which is the N-channel MOSFET. Therefore, the switching elements M1 and M3 are turned on or off simultaneously. Furthermore, the driver circuit 11*a* outputs the drive signal $S_{M2}$ that is at a low voltage only for a section of the time during which the drive signals $S_{M1}$ and $S_{M3}$ are OFF drive signals. The OFF drive signals may also be referred to as drive signals at an off level. The drive signal $S_{M2}$ is applied to the gate of the switching element M2, which is the P-channel MOSFET.

When the switching elements M1 and M3 are in the on-state, the switching element M2 is maintained in the off-state. In this case, the capacitor C1 is charged from the node Ni through the switching element M1. Conversely, when the switching elements M1 and M3 are in the off-state, the switching element M2 is in the on-state only for a section of the time.

The switching power supply circuit 11 outputs the AC excitation current $I_E$ from the capacitor C1 through the inductor L1 only for this section of the time. As a result, the AC excitation current $I_E$ has a current waveform in which a small amplitude carrier signal $S_C$ is superimposed on a large amplitude waveform of the modulation signal $S_M$ with the frequency $f_m$, as shown in FIG. 4. The AC excitation current $I_E$ may be preferably generated so that the amplitude of the waveform of the frequency of the modulation signal $S_M$ is greater than the amplitude of the frequency of the carrier signal $S_C$. That is, the switching power supply circuit 11 outputs a low-frequency AC excitation current $I_E$ while maintaining a switching frequency based on the frequency $f_C$ of the carrier signal $S_C$ in order to ensure a predetermined supply current.

The switching power supply circuit 11 includes a charge sampling stage including a switching element M1 and the capacitor C1. This allows a large current to be supplied from the capacitor C1 of the charge sampling stage, and the switching power supply circuit 11 can be configured even if its power supply capacity is reduced. As a result, the switching power supply circuit 11 can be constructed at lower cost.

Furthermore, since a large current during operation of the switching power supply circuit 11 can be supplied from the capacitor C1 of the charge sampling stage, fluctuation in the power output of the switching power supply circuit 11 can be suppressed. As a result, interference with other circuits can be suppressed, and the resistance value $R_S$ of the shunt resistor 12 can be measured with high accuracy.

As shown in FIG. 1, the power output of the switching power supply circuit 11 is applied to the shunt resistor 12, and a first voltage measurement circuit 13 measures the voltage across the shunt resistor 12. The first voltage measurement circuit 13 includes an AD converter 18 having a delta-sigma (ΔΣ) modulator. The control circuit 10 includes a timing generation circuit 10*a*, which outputs the sampling timing of the AD converter 18 of the first voltage measurement circuit 13 to the first voltage measurement circuit 13 as a timing signal.

When the timing signal is provided to the first voltage measurement circuit 13, the first voltage measurement circuit 13 samples and holds the measured voltage, and outputs the measured voltage to the signal processing circuit 14. This allows the control circuit 10 to perform control so as to synchronize the power output of the switching power supply circuit 11 with the measurement timing of the voltage measurement circuits 13 and 13*a*. In addition, the first voltage measurement circuit 13 can measure the voltage applied to the shunt resistor 12 at a timing synchronized with the power output of the switching power supply circuit 11, and can obtain the multiplied value of the resistance value $R_S$ of the shunt resistor 12 and the AC excitation current $I_E$.

As illustrated in FIG. 2, the signal processing circuit 14 includes the DSP 51 having a volatile memory and a non-volatile memory. The signal processing circuit 14 processes the signal based on the voltage measured by the first voltage measurement circuit 13 and measures the resistance value $R_S$ of the shunt resistor 12. The memory is a non-transitory tangible storage medium. For example, the signal processing circuit 14 execute signal processing at a same frequency as the output frequency of the digital output of the AD converter 18 of the first voltage measurement circuit 13 for synchronous demodulation of a signal at the same frequency as the frequency of the AC excitation current $I_E$ induced by the modulation signal $S_M$. An example of a synchronous demodulation circuit 14*a* will be described hereinafter. This makes it possible to measure the voltage applied to the shunt resistor 12 by the AC excitation current $I_E$ with higher accuracy.

The modulated carrier signal $S_{MC}$ is, for example, a signal in which a relatively high frequency carrier signal $S_C$ is superimposed on a relatively low frequency modulation signal $S_M$. For this reason, it is sufficient to adjust the component values of the switching power supply circuit 11, such as the inductor L1 and the capacitor C1, and various characteristics of the switching elements M1 to M3, to match the higher frequency carrier signal $S_C$ compared to the modulation signal SM. If the switching elements M1 to M3 are selected to accommodate low frequencies, the component values of the inductor L1 and the capacitor C1 will increase, resulting in higher costs. Therefore, by driving the switching power supply circuit 11 with the modulated carrier signal $S_{MC}$, as in the present embodiment, it is possible to easily generate the AC excitation current $I_E$ with effective cost.

According to the present embodiment, the modulation signal $S_M$, which is the multiplication of the carrier signal $S_C$ output by the control circuit 10 and the modulation signal $S_M$, is applied to the switching power supply circuit 11 to drive the switching power supply circuit 11. The power supply, including the AC excitation current $I_E$ of the switching power supply circuit 11, is applied to the shunt resistor 12. Then, the signal processing circuit 14 calculates the resistance value $R_S$ of the shunt resistor 12. As a result, the resistance value $R_S$ of the shunt resistor 12 can be measured based on the AC excitation current $I_E$ generated by the switching power supply circuit 11.

Furthermore, the power supply $V_0$ is a step-down power supply from the battery 58, and the switching power supply circuit 11 can generate the AC excitation current $I_E$ using power supply $V_0$. Therefore, it can be designed with lower power consumption and lower cost. Without the need for additional power circuits such as unnecessary regulators, it can be designed with lower power consumption and lower cost by generating the AC excitation current $I_E$ using the switching power supply circuit 11.

According to the present embodiment, it is possible to perform AC excitation at a relative low frequency of the modulation signal $S_M$ which is acquired by the carrier signal $S_C$, and minimize the influence of the skin effect of the shunt resistor 12. Thus, it is possible to reduce measurement errors based on the influence of the skin effect of the shunt resistor 12 in order to enable accurate measurement of the resistance value $R_S$ of the shunt resistor 12. According to the present embodiment, by generating the AC excitation current $I_E$ using a low-frequency modulation signal $S_M$, the respective values of inductor L1 and capacitor C1 can be reduced. As a result, the structure related to the present embodiment can be designed with lower cost.

Second Embodiment

Figure 6:
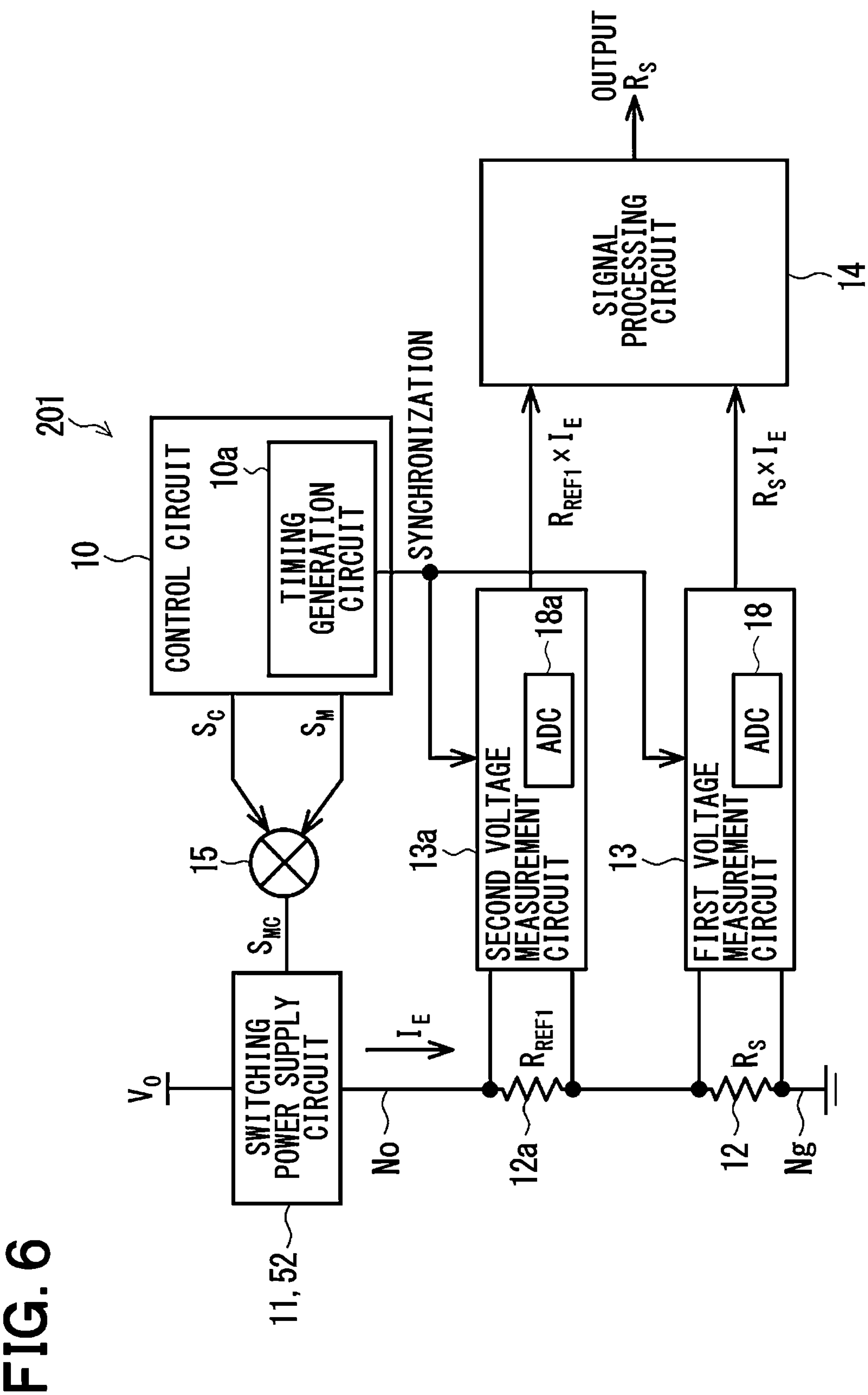
FIG. 6 is an electrical configuration diagram illustrating a shunt resistance measurement circuit according to a second embodiment.
Figure 7:
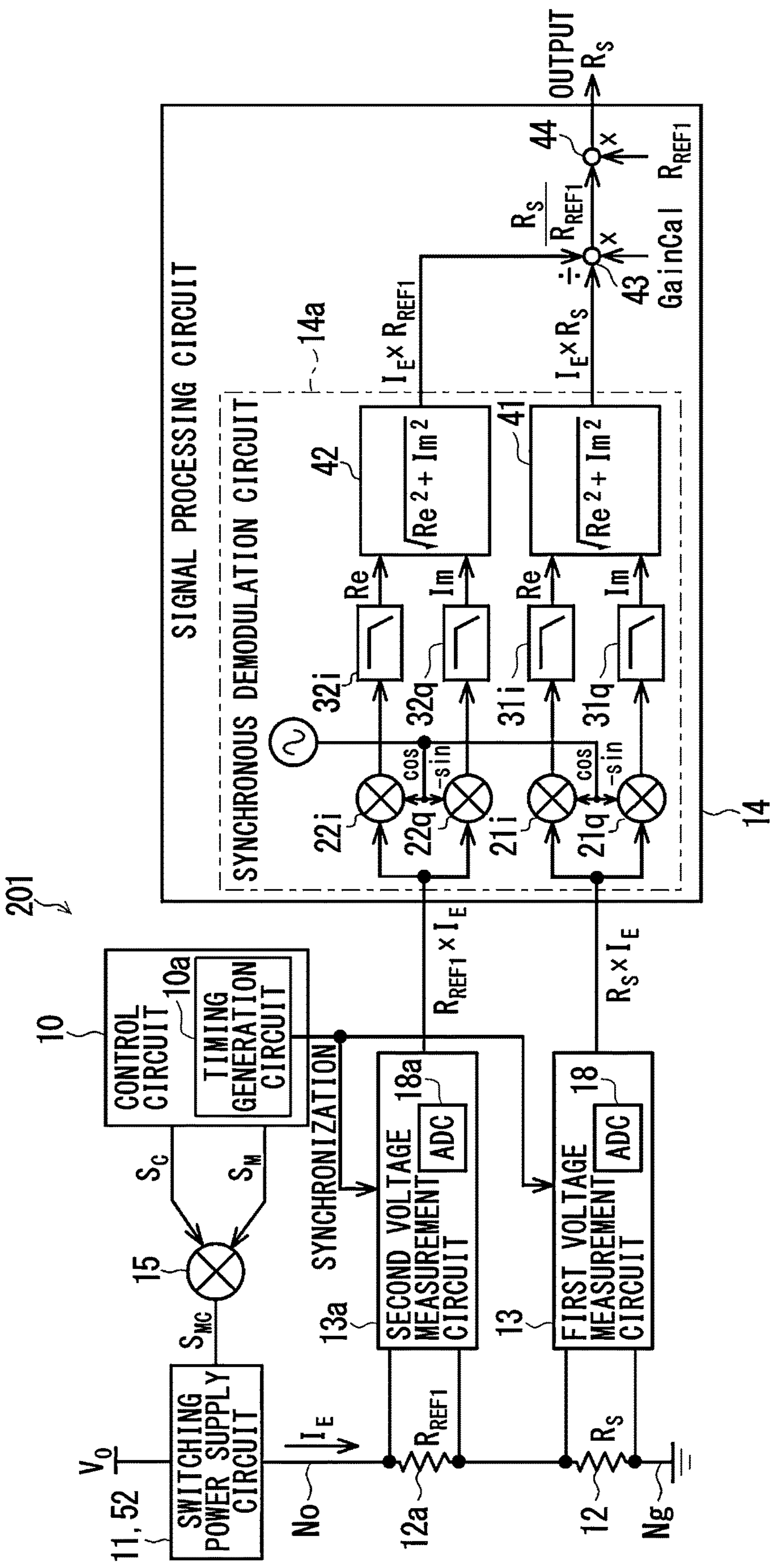
FIG. 7 is an explanatory diagram of the processing contents of a signal processing circuit in the second embodiment.

The following describes a second embodiment with reference to FIGS. 6 and 7. The shunt resistance measurement circuit 201 includes the components of the shunt resistance measurement circuit 1, a reference resistor 12*a* and a second voltage measurement circuit 13*a*. The reference resistor 12*a* is connected in series to the shunt resistor 12, and the output of the power supply of the switching power supply circuit 11 is supplied to the reference resistor 12*a*. The material of the reference resistor 12*a* may include tantalum nitride, titanium nitride, or nitride. By using material with minimal changes in characteristics due to temperature variations and minimal durability degradation, it is possible to construct the reference resistor 12*a* that allows for high-precision measurement of the resistance value $R_S$ of the shunt resistor 12.

The reference resistor 12*a* and the shunt resistor 12 are connected in series between a power supply output node No and a ground node Ng of the switching power supply circuit 11. The reference resistor 12*a* is a highly accurate resistor used as a measurement reference, and its resistance value is typically 2 to 3 to 6 digits multiplied by the resistance value of the shunt resistor 12, for example, around 10 ohms. As mentioned later, the resistance value $R_S$ of the shunt resistor 12 is measured by taking the ratio of the shunt resistor 12 to the reference resistor 12*a*. For this reason, it would be easier to make measurements if similar resistance values were selected. However, generally available high-precision, low-degradation reference resistor 12*a* has a resistance value of 10 ohms or higher. Therefore, the reference resistor 12*a* and the shunt resistor 12 are constructed using resistors with significantly different resistance values, $R_{REF1}$ and $R_S$, respectively.

The second voltage measurement circuit 13*a* measures the voltage across the reference resistor 12*a*. The control circuit 10 controls the power output of the switching power supply circuit 11 and the measurement timing of the first voltage measurement circuit 13 and the second voltage measurement circuit 13*a* to be synchronized by the timing generation circuit 10*a*. Furthermore, the timing at which the second voltage measurement circuit 13*a* measures the voltage across the reference resistor 12*a* is synchronized with the timing at which the first voltage measurement circuit 13 measures the voltage across the shunt resistor 12. Since the first voltage measurement circuit 13 and the second voltage measurement circuit 13*a* are synchronized based on the sample base, there is no need for synchronization between the signal processing circuit 14 and the control circuit 10. As a result, it is possible to reduce wiring and other synchronization circuits.

The signal processing circuit 14 processes the signal based on the respective voltages measured by the first voltage measurement circuit 13 and the second voltage measurement circuit 13*a*, and measures the resistance value $R_S$ of the shunt resistor 12. The other configurations are the same as those of the first embodiment.

According to such a configuration, since the reference resistor 12*a* is used as the measurement reference, a highly accurate reference current generation circuit is not necessary. Therefore, the configuration can be made at lower cost. The measurement timing of the first voltage measurement circuit 13 and the measurement timing of the second voltage measurement circuit 13*a* are synchronized with the power output of the switching power supply circuit 11. Therefore, the signal processing circuit 14 can perform highly accurate synchronous demodulation and effectively remove noise other than the main component of the AC excitation current $I_E$ (for example, the fundamental frequency of the modulation signal $S_M$).

The first voltage measurement circuit 13 includes an AD converter 18 that measures the voltage across the shunt resistor 12 by the AC excitation current $I_E$ and converts the voltage measurement result of the shunt resistor 12 into a digital signal. The second voltage measurement circuit 13*a* includes an AD converter 18*a* that measures the voltage across the reference resistor 12*a* by the AC excitation current $I_E$ and converts the voltage measurement result of the reference resistor 12*a* into a digital signal.

The signal processing circuit 14 executes the signal processing at the same frequency as the respective frequencies of the digital output of the AD converter 18 of the first voltage measurement circuit 13 and the digital output of the AD converter 18*a* of the second voltage measurement circuit 13*a* for synchronous demodulation at the same frequency as the frequency of the AC excitation current $I_E$ induced by the modulation signal $S_M$.

As illustrated in FIG. 7, the signal processing circuit 14 includes the synchronous demodulation circuit 14*a*, a divider 43, and a multiplier 44. The synchronous demodulation circuit 14*a* includes mixers 21*i*, 21*q*, 22*i*, and 22*q*, filters 31*i*, 31*q*, 32*i*, and 32*q*, and absolute value calculators 41 and 42.

When the mixers 21*i* and 21*q* receive the measurement result of the first voltage measurement circuit 13, they mix (multiply) the sample synchronization signals of the first voltage measurement circuit 13 and the second voltage measurement circuit 13*a* as signal data that are out of phase with each other by 90°, and output the result to the filters 31*i* and 31*q*, respectively. The filters 31*i* and 31*q* are low-pass filters that restrict the bandwidth of the respective input signal data, and output the signal data that has passed through the low-frequency range to the absolute value calculator 41.

The outputs of filters 31*i* and 31*q* represent the real component Re and imaginary component Im, respectively. The absolute value calculator 41 calculates the square root of the sum of squares of the real component Re and imaginary component Im, and outputs the calculated result as the output of the synchronous demodulation circuit 14*a*. This result is output to the divider 43. The synchronous demodulation circuit 14*a* outputs the measurement result of the shunt resistor 12, calculated as the product of the AC excitation current $I_E$ and the resistance value $R_S$ of the shunt resistor 12, to the divider 43. The product of the AC excitation current $I_E$ and the resistance value $R_S$ of the shunt resistor 12 can also be expressed as "$I_E \times R_S$".

On the other hand, mixers 22*i* and 22*q* receive the measurement results from the second voltage measurement circuit 13*a*, and mix (multiply) the measurement results with respective sample synchronous signals of the first voltage measurement circuit 13 and the second voltage measurement circuit 13*a*, which have a phase difference of 90 degrees. Thus, signal data are produced with different phases. The signal data are then output to filters 32*i* and 32*q*, respectively. The filters 32*i* and 32*q* are low-pass filters that restrict the bandwidth of the respective input signal data, and output the signal data that have passed through the low-frequency range to the absolute value calculator 42.

The respective output voltages of filters $\mathbf{32}_i$ and $\mathbf{32}_q$ represent the real component Re and imaginary component Im. The absolute value calculator 42 calculates the square root of the sum of squares of the real component Re and imaginary component Im, and outputs the calculated result as the output of the synchronous demodulation circuit 14*a*. This result is output to the divider 43. The synchronous demodulation circuit 14*a* outputs the measurement result of the reference resistor 12*a*, calculated as the product of the AC excitation current $I_E$ and the resistance value $R_{REF1}$ of the reference resistor 12*a*, to the divider 43. The product of the AC excitation current $I_E$ and the resistance value $R_{REF1}$ of the shunt resistor 12 can also be expressed as "$I_E \times R_{REF1}$".

The signal processing circuit 14 performs calculation using the divider 43 and the multiplier 44 based on the two output results of the synchronous demodulation circuit 14*a*. The signal processing circuit 14 measures the resistance value $R_S$ of the shunt resistor 12 by dividing the measurement result $I_E \times R_S$ of the shunt resistor 12 by the measurement result $I_E \times R_{REF1}$ of the reference resistor 12*a* using the divider 43, and then multiplying the obtained quotient with the reference resistance value $R_{REF1}$ of the reference resistor 12*a*, which is pre-stored value, using the multiplier 44.

The reference resistance value $R_{REF1}$ of the reference resistor 12*a* is measured preliminarily during manufacture or inspection of the reference resistor 12*a*, and is stored preliminarily in a non-volatile memory (not shown) of the signal processing circuit 14. Therefore, the signal processing circuit 14 can eliminate the influence of the AC excitation current $I_E$ by executing the above-mentioned predetermined calculation using the divider 43 and the multiplier 44. Therefore, the influence of noise other than the main component contained in the AC excitation current $I_E$, such as disturbances and low-frequency noise (1/f noise, offset, etc.) of the first voltage measurement circuit 13 and the second voltage measurement circuit 13*a*, can be eliminated. As a result, the resistance value $R_S$ of the shunt resistor 12 can be measured with higher accuracy.

Third Embodiment

Figure 8:
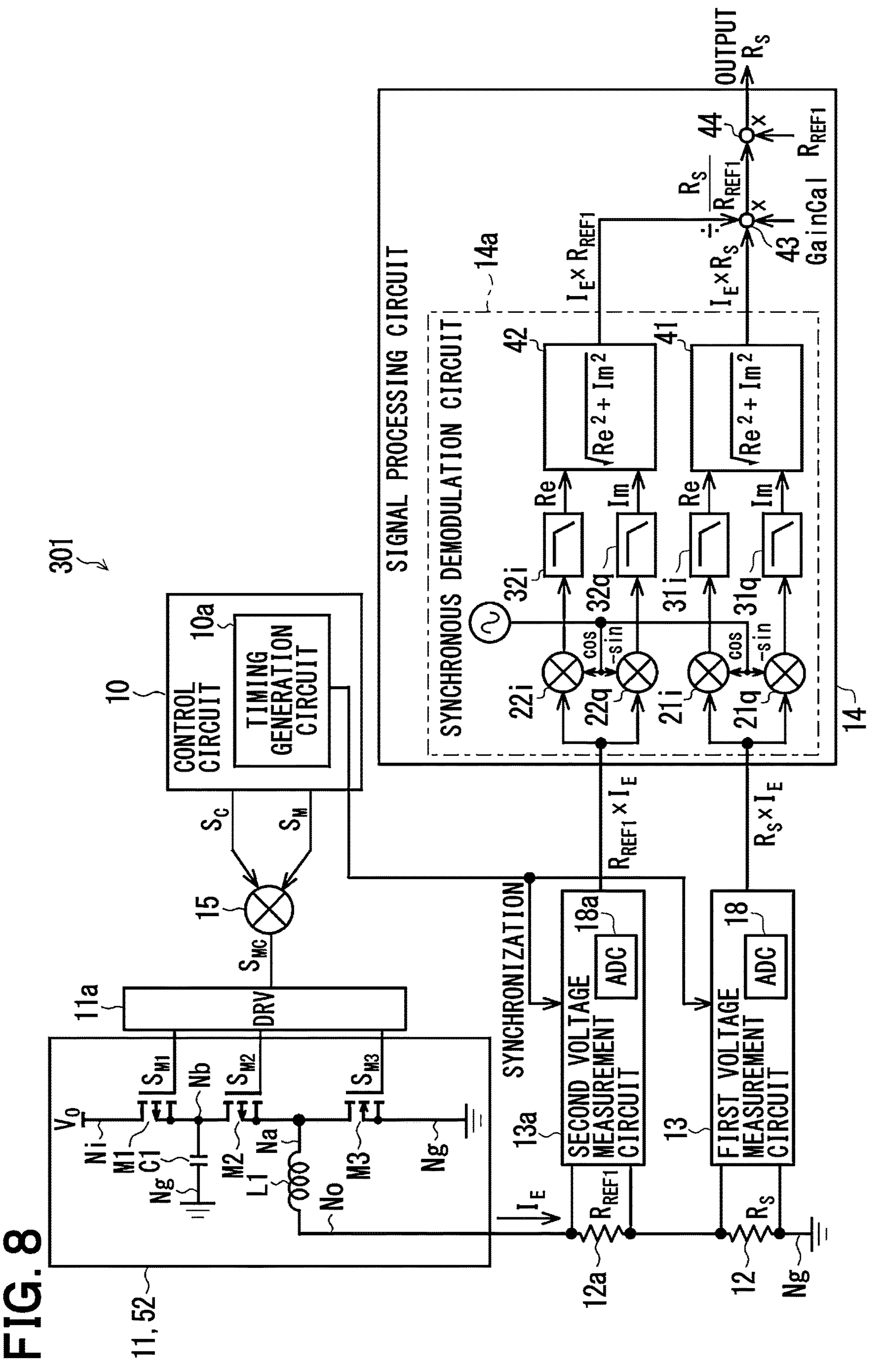
FIG. 8 is an electrical configuration diagram illustrating a shunt resistance measurement circuit according to a third embodiment.

The following describes a third embodiment with reference to FIG. 8. The specific configuration of the switching power supply circuit 11 shown in FIG. 3 related to the first embodiment achieves sufficient advantageous effects even when the reference resistor 12*a*, as shown in the second embodiment, is connected in series with the shunt resistor 12. FIG. 8 illustrates a specific configuration of a shunt resistance measurement circuit 301 to which the specific configuration of the switching power supply circuit 11 in FIG. 3 is applied and to which the reference resistor 12*a* is applied.

According to the configuration of the shunt resistance measurement circuit 301, the impedance (the resistance value $R_{REF}$) of the reference resistor 12*a*, to which the AC excitation current $I_E$ is supplied, is small at several tens of ohms. In addition, the impedance (the resistance value $R_S$) of the shunt resistor 12 is small at several tens of microohms. Therefore, as compared with a so-called conventional diode rectification method by using the switching element M3 that meets the condition of lower on-resistance, the switching power supply circuit 11 can output power with relatively low power consumption.

Additionally, by providing a charge sampling stage using the switching element M1 and the capacitor C1, it is possible to supply a large current from the capacitor C1 of the charge sampling stage, in order to lower the power supply capacity of the switching power supply circuit 11. As a result, the switching power supply circuit 11 can be constructed at lower cost.

Furthermore, since a large current during operation of the switching power supply circuit 11 can be supplied from the capacitor C1 of the charge sampling stage, fluctuation in the power supply output of the switching power supply circuit 11 can be suppressed. As a result, interference with other circuits can be suppressed, and the resistance value of the shunt resistor 12 can be measured with higher accuracy.

Fourth Embodiment

Figure 9:
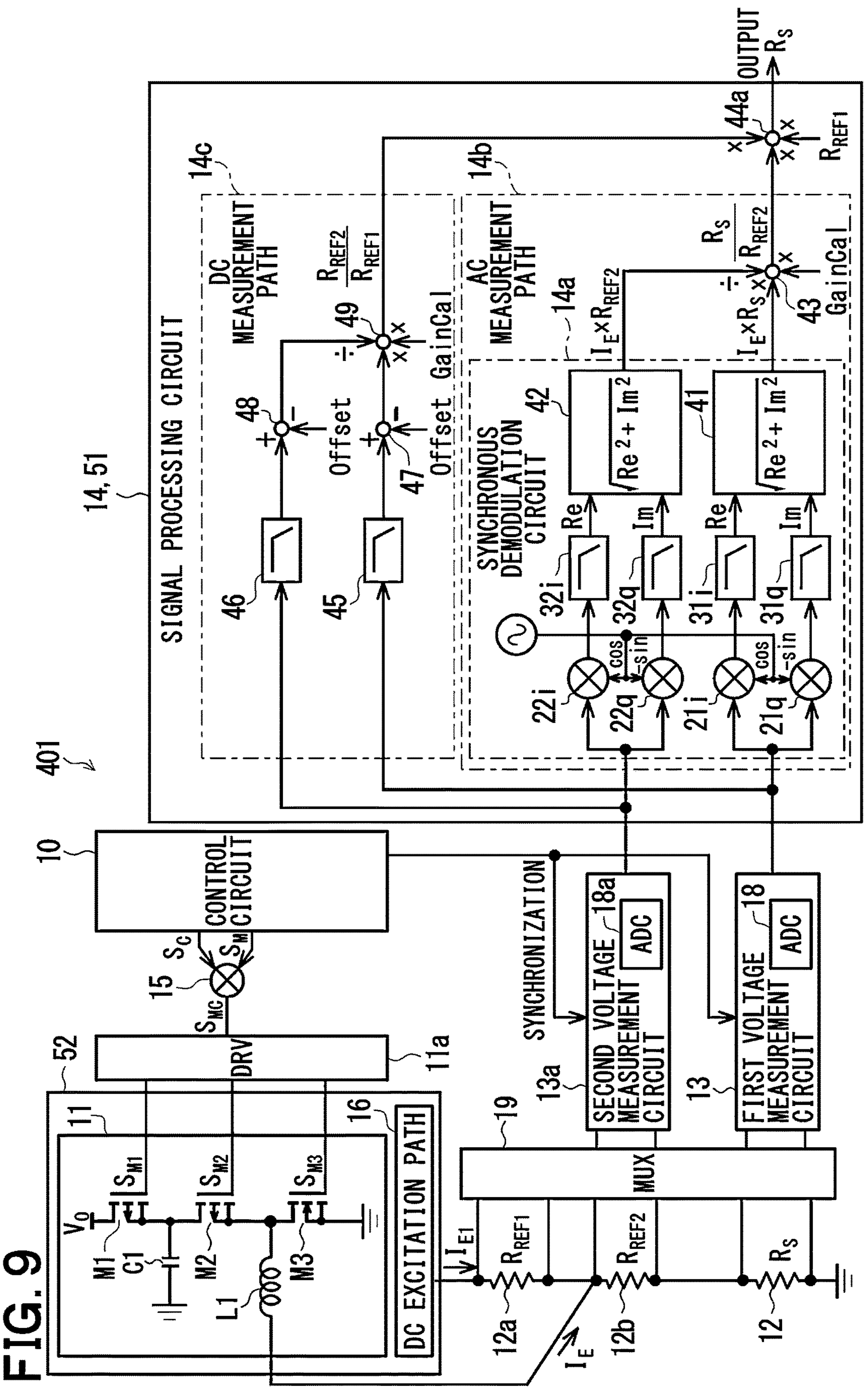
FIG. 9 is a configuration example of a shunt resistance measurement circuit according to a fourth embodiment.

The following describes a fourth embodiment with reference to FIG. 9. A shunt resistance measurement circuit 401 illustrated in FIG. 9 includes a first reference resistor 12*a* and a second reference resistor 12*b*. The first reference resistor 12*a* and the second reference resistor 12*b* are connected in series to the shunt resistor 12. In the present embodiment, the resistance value $R_S$ of the shunt resistor 12 is measured by taking the ratio between the reference resistor 12*a* and the reference resistor 12*b* and the ratio between the shunt resistor 12 and the reference resistor 12*b*. For this reason, it would be easier to make measurements if similar resistance values were selected. However, generally available reference resistor 12*a* with high precision and low degradation has a resistance value of 10 ohms or higher. Therefore, the reference resistor 12*a* and the shunt resistor 12 are constructed using resistors with significantly different resistance values, $R_{REF1}$ and $R_S$, respectively. If the resistance ratio becomes too small, the signal entering the voltage measurement circuit decreases, resulting in a poor signal-to-noise ratio and a degradation in resistance measurement accuracy. Therefore, in order to achieve high-precision resistance measurement, a difference resistance of several tens of milliohms is selected between the shunt resistor RREF2, which is several tens of microohms, and the reference resistor 12*a*, which is ten ohms or more, in order to increase the resistance ratio. As a result, with regard to the relationship among the resistance value $R_{RREF1}$ of the first reference resistor 12*a*, the resistance value $R_{REF2}$ of the second reference resistor 12*b*, and the resistance value $R_S$ of the shunt resistor 12, these resistance values are set to satisfy a condition of $R_{REF1}>>R_{REF2}>>R_S$. In other words, $R_{REF1}$ is much greater than $R_{REF2}$, and $R_{REF2}$ is much greater than $R_S$. The relationship between the resistance value $R_{REF1}$ and the resistance value $R_{REF2}$, and the relationship between the resistance value $R_{REF2}$ and the resistance value $R_S$ may be set to a difference of one to two digits, or two to three digits, for example, about 10:1 to 100:1, or about 100:1 to 1000:1.

Further, the shunt resistance measurement circuit 401 includes a DC excitation circuit 16 as a power supply different from the switching power supply circuit 11. The shunt resistance measurement circuit 401 also includes a multiplexer 19. The DC excitation circuit 16 is provided with a regulator capable of turning on and off the output under the control of the control circuit 10, and outputs a DC current $I_{E1}$. The first reference resistor 12*a*, the second reference resistor 12*b*, and the shunt resistor 12 are connected in series between the DC excitation circuit 16 and the ground node Ng.

The multiplexer 19 is arranged among the first reference resistor 12*a*, the second reference resistor 12*b*, the shunt resistor 12, the first voltage measurement circuit 13 and the second voltage measurement circuit 13*a*. The multiplexer 19 is capable of switching between input and output under the control of the control circuit 10. In the present embodiment, the series circuit of the second reference resistor 12*b*, the first reference resistor 12*a*, and the shunt resistor 12 is constructed so that power can be supplied from the DC excitation circuit 16.

The material of the first reference resistor 12*a* and the second reference resistor 12*b* may include tantalum nitride, titanium nitride, or nitride. By using material with minimal characteristic changes and minimal durability degradation due to temperature variation, it is possible to construct the first reference resistor 12*a* and the second reference resistor 12*b*, in order to enable high-precision measurement of the resistance value $R_S$ of the shunt resistor 12.

The signal processing circuit 14 measures the resistance value $R_S$ of the shunt resistor 12 in a first measurement process and a second measurement process. In the first measurement process, the control circuit 10 stops the operation of the switching power supply circuit 11 by turning off all of the switching elements M1 to M3 included in the switching power supply circuit 11. Then, the control circuit 10 controls the current $I_{E1}$ of the DC excitation circuit 16 to be in an on-state. Furthermore, the control circuit 10 switches the input and output of the multiplexer 19, allowing the second voltage measurement circuit 13*a* to measure the voltage across the first reference resistor 12*a*, and the first voltage measurement circuit 13 to measure the voltage across the second reference resistor 12*b*. The first measurement process may also be referred to as "step 1" in, for example, FIG. 10. The second measurement process may also be referred to as "step 2" in, for example, FIG. 10.

In the first measurement process, the signal processing circuit 14 processes the measurement results obtained by the second voltage measurement circuit 13*a* and the first voltage measurement circuit 13 for the first reference resistor 12*a* and the second reference resistor 12*b*, respectively. Based on these measurement results, the signal processing circuit measures the resistance value $R_{RREF1}$ of the first reference resistor 12*a* and the resistance value $R_{RREF2}$ of the second reference resistor 12*b*.

In the first measurement process, the signal processing circuit 14 measures the resistance ratio between the resistance value $R_{REF1}$ of the first reference resistor 12*a* and the resistance value $R_{REF2}$ of the second reference resistor 12*b* using a DC measurement path 14*c* shown in FIG. 9. The DC measurement path 14*c* includes filters 45 and 46, as well as adders/subtractors 47 and 48 and a divider 49.

The filter 45 passes the low frequency components of the voltage measured by the first voltage measurement circuit 13 and cuts out high frequency noise exceeding the DC component. The filter 46 passes the low frequency components of the voltage measured by the second voltage measurement circuit 13*a* and cuts out high frequency noise exceeding the DC component.

The adder/subtractor 47 subtracts a pre-stored offset from the DC component of the voltage measured by the first voltage measurement circuit 13. The adder/subtractor 48 subtracts a pre-stored offset from the DC component of the voltage measured by the second voltage measurement circuit 13*a*. This offset is added or subtracted in order to minimize the influence of low-frequency noise (1/f noise, offset) of the first voltage measurement circuit 13 and the second voltage measurement circuit 13*a*.

The divider 49 divides the output of the adder/subtractor 48 by the output of the adder/subtractor 47. As a result, the divider 49 can measure the result $R_{REF2}/R_{REF1}$ acquired by dividing the resistance value $R_{REF2}$ of the second reference resistor 12*b* by the resistance value $R_{REF1}$ of the first reference resistor 12*a*, while eliminating the influence of the current $I_{E1}$ of the DC excitation circuit 16. The output of the divider 49 is output to a multiplier 44*a*.

On the other hand, in the second measurement process, the signal processing circuit 14 processes the measurement voltage across the second reference resistor 12*b* and the measurement voltage across the shunt resistor 12, and measures the resistance ratio between the resistance value $R_{REF2}$ of the second reference resistor 12*b* and the resistance value $R_S$ of the shunt resistor 12 based on these measurement voltages. In the second measurement process, the signal processing circuit 14 may measure the resistance ratio using an AC measurement path 14*b*.

The AC measurement path 14*b* includes the synchronous demodulation circuit 14*a* and the divider 43. In the second measurement process, the control circuit 10 controls the switching power supply circuit 11 to output the AC excitation current $I_E$, and controls the current $I_{E1}$ of the DC excitation circuit 16 to turn off the DC excitation circuit 16. The control circuit 10 switches the input and output of the multiplexer 19 to cause the second voltage measurement circuit 13*a* to measure the voltage across the second reference resistor 12*b* and the first voltage measurement circuit 13 to measure the voltage across the shunt resistor 12.

When the synchronous demodulation is performed based on the operation described in the preceding embodiment, the synchronous demodulation circuit 14*a* outputs a value, which is the product of the AC excitation current $I_E$ and the resistance value $R_{REF2}$ of the second reference resistor 12*b* (in other words, $I_E \times R_{REF2}$), to the divider 43, and also outputs a value, which is the product of the AC excitation current $I_E$ and the resistance value $R_S$ of the shunt resistor 12 (in other words, $I_E \times R_S$), to the divider 43. The divider 43 can calculate the resistance ratio $R_S/R_{REF2}$ between the resistance value $R_S$ of the shunt resistor 12 and the resistance value $R_{REF2}$ of the second reference resistor 12$b$. In addition, the divider 43 can adjust the resistance ratio $R_S/R_{REF2}$ to a practical and manageable value by multiplying the resistance ratio $R_S/R_{REF2}$ with a predetermined gain adjustment (GainCal).

The signal processing circuit 14 includes the multiplier 44$a$ provided after the DC measurement path 14$c$ and the AC measurement path 14$b$. The multiplier 44$a$ calculates the resistance ratio $R_S/R_{REF1}$ by multiplying the resistance ratio $R_{REF2}/R_{REF1}$ between the resistance values $R_{REF1}$ and $R_{REF2}$ measured in the first measurement process, and the resistance ratio $R_S/R_{REF2}$ between the resistance values $R_{REF2}$ and $R_S$ measured in the second measurement process. Moreover, the multiplier 44$a$ can measure the resistance value $R_S$ of the shunt resistor 12 by multiplying the resistance ratio $R_S/R_{REF1}$ by the reference resistance value $R_{REF1}$ that is preliminarily stored in the memory. In this manner, the resistance value $R_S$ of the shunt resistor 12 can be measured.

As described above, the relationship between the resistance value $R_{REF1}$ and the resistance value $R_{REF2}$, and the relationship between the resistance value $R_{REF2}$ and the resistance value $R_S$ may be set to a difference of one to two digits, or two to three digits, for example, about 10:1 to 100:1, or about 100:1 to 1000:1. The first voltage measurement circuit 13 and the second voltage measurement circuit 13$a$ selectively measure the respective resistance values $R_{REF1}$, $R_{REF2}$, and $R_S$ of the first reference resistor 12$a$, the second reference resistor 12$b$, and the shunt resistor 12. The signal processing circuit 14 measures the resistance value $R_S$ of the shunt resistor 12 using the voltage ratio and resistance ratio of the terminal voltages of two of the resistance values $R_{REF1}$, $R_{REF2}$, and $R_S$.

With this configuration, the first voltage measurement circuit 13 and the second voltage measurement circuit 13$a$ can suppress the difference in terminal voltage measured by each circuit to, for example, around −60 dB. Even when the resistance value RS of the shunt resistor 12 is measured based on the resistance ratio as described above, it is possible to perform measurement while minimizing the influence of noise.

As mentioned earlier, the resistance value $R_{REF1}$ of the first reference resistor 12$a$ is set to a high-precision resistance of 10 ohms, while the resistance value $R_S$ of the shunt resistor 12, which is the measurement target, is significantly different, with a magnitude of several tens of microohms and approximately six orders of magnitude apart from the resistance value $R_{REF1}$. However, by dividing the resistance value $R_S$ of the shunt resistor 12 into two measurement processes as described in the above-mentioned first measurement process and second measurement process, it becomes possible to compensate for and reduce the influence of various noises that occur in the first voltage measurement circuit 13 and the second voltage measurement circuit 13$a$, in order to enable high-precision measurement of the resistance value $R_S$ of the shunt resistor 12.

According to the present embodiment, the three resistors can be switched by the multiplexer 19, and the voltages can be measured by the two voltage measurement circuits 13, 13$a$, so that the configuration can be made at lower cost. When the signal processing circuit 14 executes the first measurement process, the operation of the switching power supply circuit 11 used in the second measurement process is stopped. This is because by eliminating the influence of the output impedance of the switching power supply circuit 11, it is possible to reduce the measurement error of the resistance value $R_S$ of the shunt resistor 12.

If the configuration is adopted, as in the present embodiment, where the output of the switching power supply circuit 11 is directly connected to the first reference resistor 12$a$, by turning off all the switching elements M1 to M3 of the switching power supply circuit 11, it is possible to maintain a high output impedance of the switching power supply circuit 11. As a result, the resistance value $R_S$ of the shunt resistor 12 can be measured while minimizing the influence of the switching power supply circuit 11. An additional switch may be provided between the output node No of the switching power supply circuit 11 and the first reference resistor 12$a$.

Modification

In the above example, the resistance value $R_S$ is measured in two separate measurement processes. However, the present disclosure is not limited to this example, and the resistance value $R_S$ may be measured in three or more separate measurement processes. In other words, not limited to just the first reference resistor 12$a$ and the second reference resistor 12$b$, the configuration includes connecting other reference resistors, such as the third reference resistor, in series with the shunt resistor 12. By measuring the voltage across these reference resistors in pairs and calculating their resistance ratios, the resistance value $R_S$ of the shunt resistor 12 can be measured by multiplying the calculated ratios. This detailed description is omitted.

Fifth Embodiment

Figure 10:
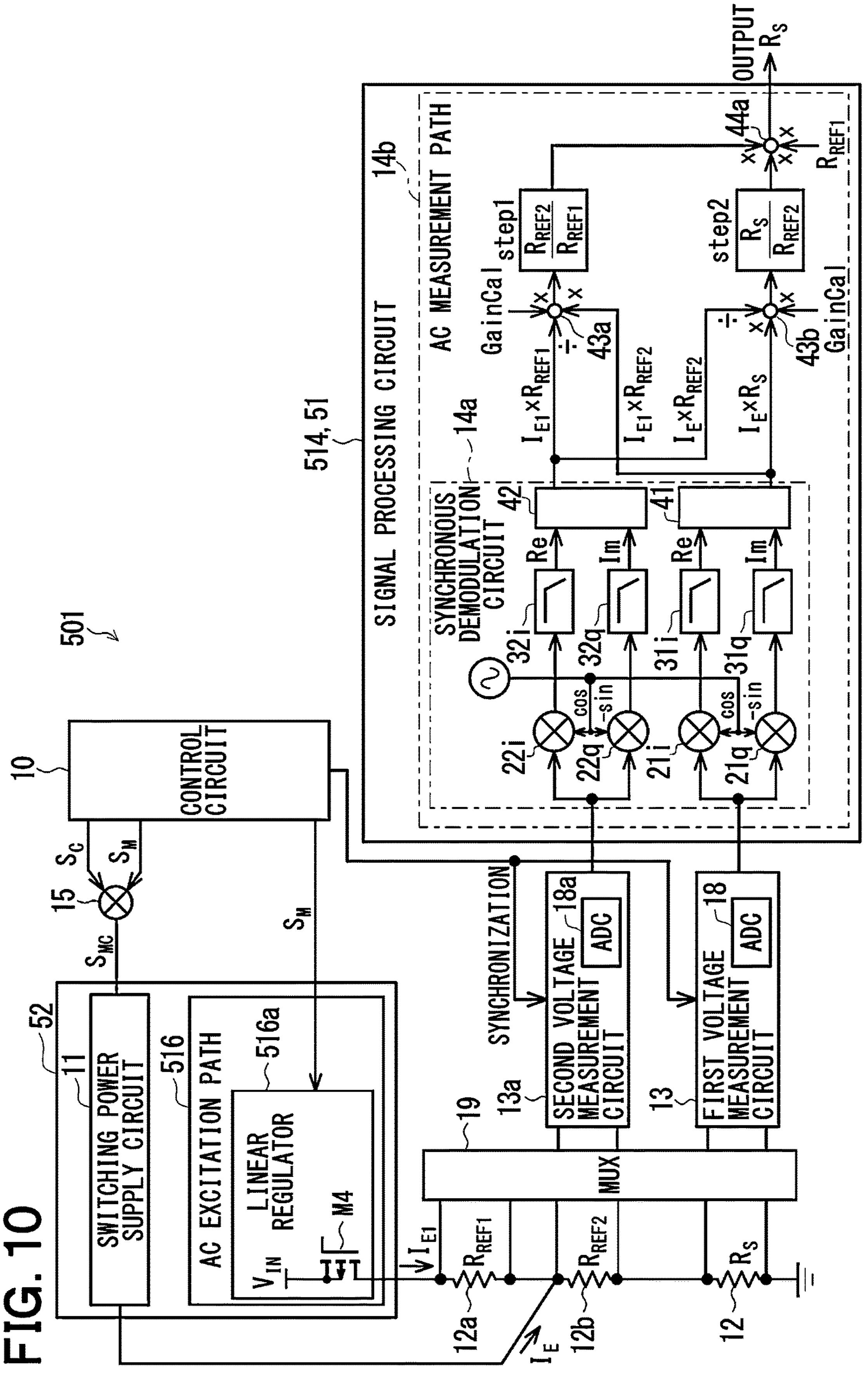
FIG. 10 is a configuration example of a shunt resistance value measuring circuit according to a fifth embodiment.
Figure 11:
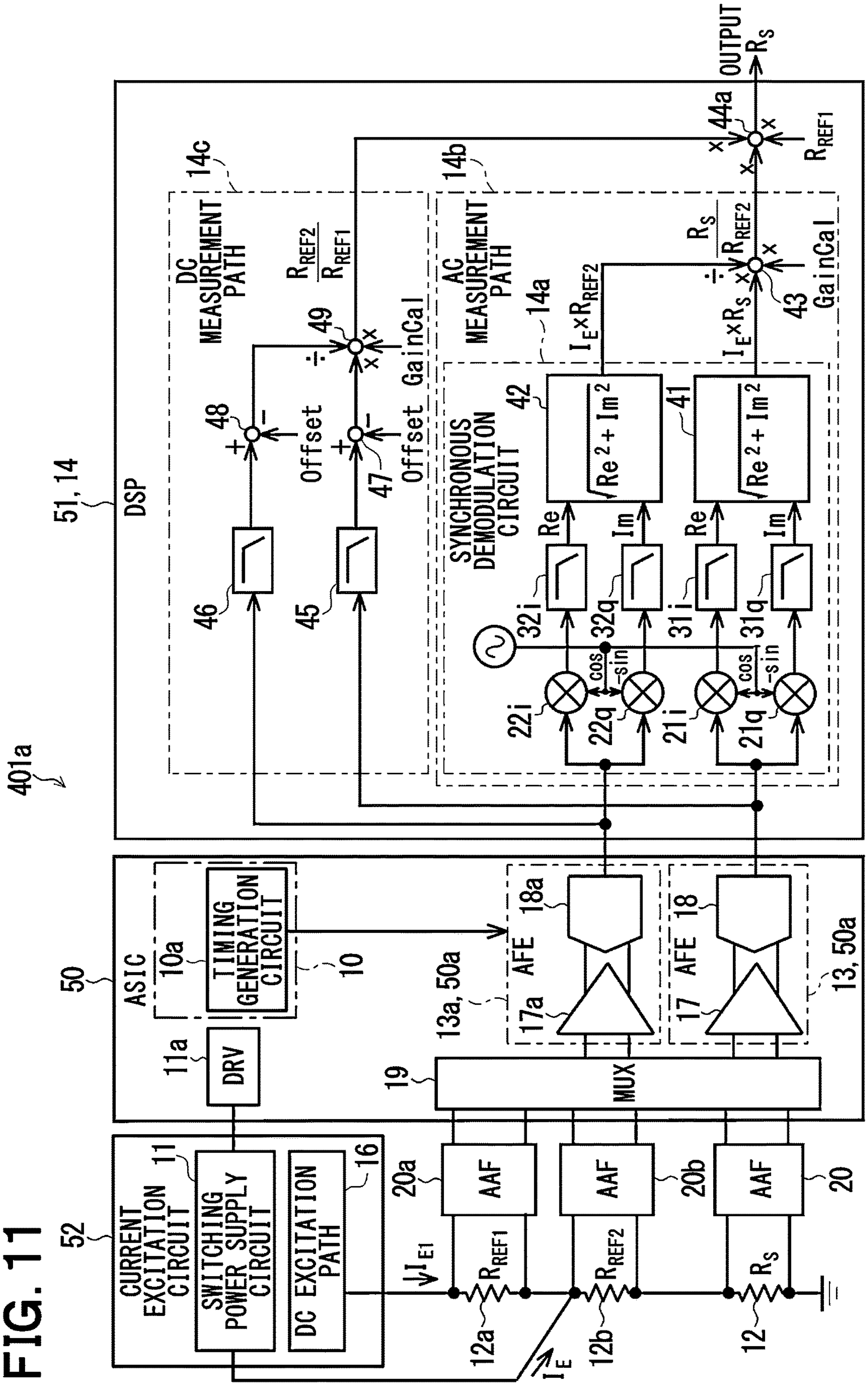
FIG. 11 is a first example of a configuration of a shunt resistance measurement circuit according to the sixth embodiment.

The following describes a fifth embodiment with reference to FIG. 10. The following describes the differences from the fourth embodiment, but omits the description of the same parts. FIG. 10 illustrates the overall configuration of a shunt resistance measurement circuit 501, and FIG. 11 illustrates the details of a signal processing circuit 514. As shown in FIG. 10, the shunt resistance measurement circuit 501 includes an AC excitation circuit 516 as a power supply instead of the DC excitation circuit 16 described in the preceding embodiment.

The AC excitation circuit 516 may generate the AC excitation current $I_{E1}$ by connecting the configuration of the control circuit 10 described in the preceding embodiment. The AC excitation circuit 516 may include a linear regulator (LDO) 516$a$ to which the modulation signal $S_M$ is applied. At this time, the linear regulator 516$a$ provides the input DC voltage $V_{IN}$ to a switching element M4, and toggles the switching element M4 with the modulation signal $S_M$ provided from the control circuit 10, thereby generating the AC excitation current $I_{E1}$.

The AC excitation circuit 516 drives the switching element M4 by the modulation signal $S_M$ output from the control circuit 10. The use of such a linear regulator 516$a$ allows for lower degree of implementation of the power supply capability of the AC excitation circuit 516, in order to be constructed with low-cost components. The present embodiment has the same advantages as those of the preceding embodiments.

Moreover, the shunt resistance measurement circuit 501 includes the signal processing circuit 514 instead of the signal processing circuit 14. As shown in FIG. 10, the signal processing circuit 514 includes an AC measurement path 14$b$ but not the DC measurement path 14$c$. The signal processing circuit 514 may also be included in the DSP 51. In the present embodiment, in the first measurement process, the current supplied to the first reference resistor 12_a_ and the second reference resistor 12_b_ may be the AC excitation current $I_{E1}$.

If the AC excitation circuit 516 supplies the AC excitation current $I_{E1}$, the synchronous demodulation process of the signal processing circuit 514 can be shared between the first measurement process and the second measurement process. In this case, the excitation circuits for the first measurement process and the second measurement process, such as the control circuit 10 that generates the modulation signal SM, can be shared and implemented at lower cost.

The signal processing circuit 514 executes measurements through the synchronous demodulation circuit 14_a_ of the AC measurement path 14_b_ in both the first measurement process and the second measurement process. In addition to the second measurement process, by also performing synchronous demodulation in the first measurement process, it is possible to accurately measure and remove noise, such as disturbances, low-frequency noise (1/f noise, offset, etc.) in the first voltage measurement circuit 13 and the second voltage measurement circuit 13_a_, other than the main component of the AC excitation current $I_{E1}$.

The signal processing circuit 514 includes dividers 43_a_, 43_b_, and a multiplier 44_a_. In the first measurement process, the divider 43_a_ divides the output value $I_{E1}\times R_{REF2}$ of the absolute value calculator 41 by the output value $I_{E1}\times R_{REF1}$ of the absolute value calculator 42, and multiplies the calculated result by the gain. Thus, it is possible divide the resistance value $R_{REF2}$ of the second reference resistor 12_b_ by the resistance value $R_{REF1}$ of the first reference resistor 12_a_. The divider 43_a_ outputs the result of this division to the multiplier 44_a_. In the second measurement process, the signal processing circuit 514 can divide the resistance value $R_S$ of the shunt resistor 12 by the resistance value $R_{REF2}$ of the second reference resistor 12_b_ by the divider 43_b_ dividing the output value $I_E\times R_S$ of the absolute value calculator 41 by the output value $I_E\times R_{REF2}$ of the absolute value calculator 42 and multiplying the calculated result by the gain. The divider 43_b_ outputs the result of this division to the multiplier 44_a_.

The signal processing circuit 514 multiplies the measurement result acquired by the first measurement process with the measurement result acquired by the second measurement process using the multiplier 44_a_, and measures the resistance value $R_S$ of the shunt resistor 12 by multiplying the calculated result with the pre-stored reference resistance value $R_{REF1}$ of the first reference resistor 12_a_. Since one of the first voltage measurement circuit 13 and the second voltage measurement circuit 13_a_ is divided by the output of the other, noise contained in the AC excitation currents $I_E$ and $I_{E1}$ can be removed, and the resistance value $R_S$ of the shunt resistor 12 can be measured with higher accuracy. The elements of the signal processing circuit 514 used in the first measurement process and the second measurement process (for example, the multiplier 44_a_) can be shared, and can be implemented at lower cost.

Sixth Embodiment

Figure 12:
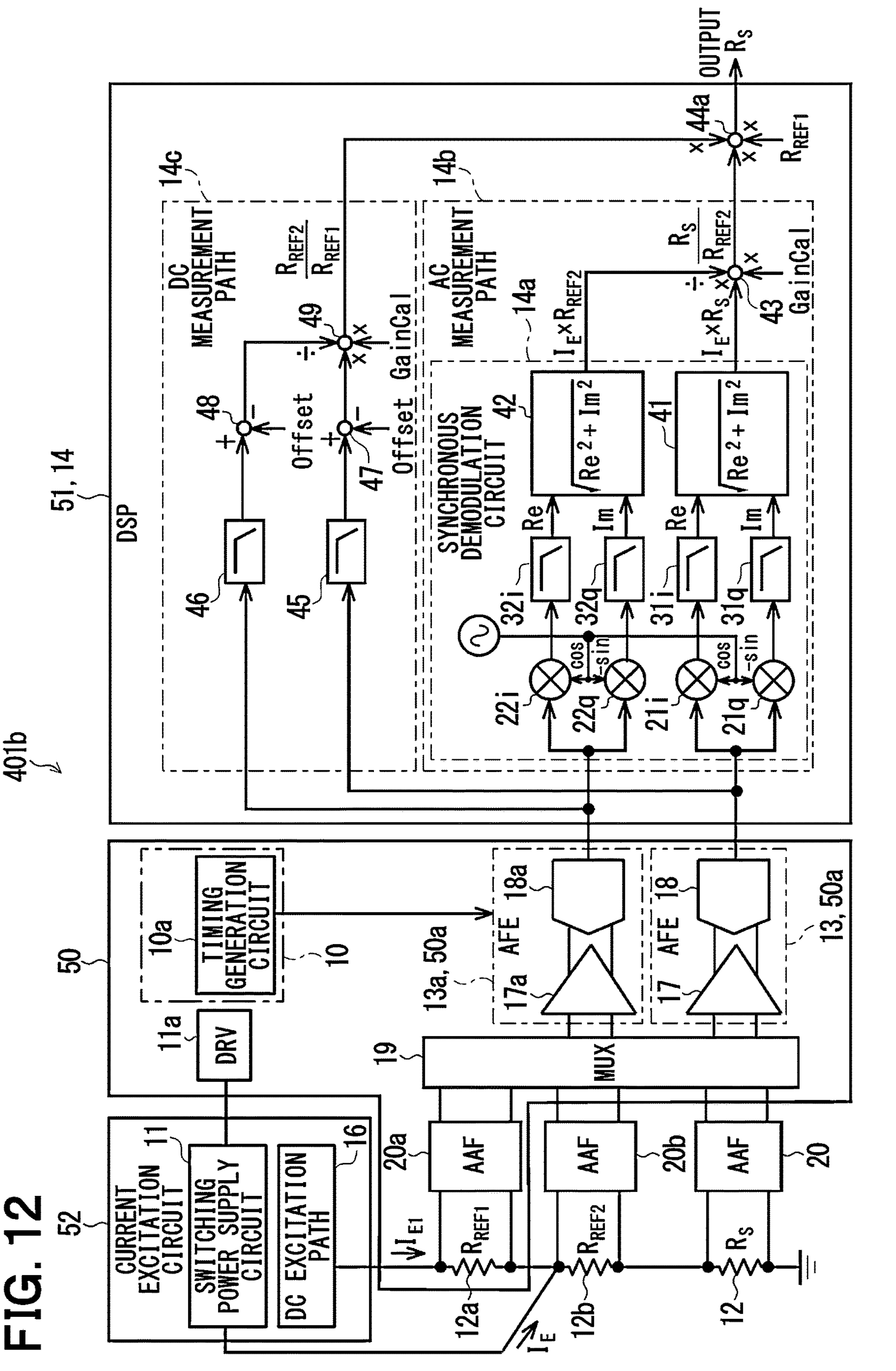
FIG. 12 is a second example of a configuration of a shunt resistance measuring circuit according to the sixth embodiment.

The following describes a sixth embodiment with reference to FIGS. 11 and 12. FIGS. 11 and 12 illustrates respective desirable hardware configurations of the shunt resistance measurement circuits 401_a_, 401_b_ according to the fourth embodiment. As illustrated in FIG. 11 or 12, blocks included in the shunt resistance measurement circuits 401_a_, 401_b_ may be divided into hardware such as the ASIC 50 as the integrated circuit, the DSP 51, and the current excitation circuit 52.

As illustrated in FIG. 11, the ASIC 50 includes a driver circuit 11_a_, a control circuit 10 including the timing generation circuit 10_a_, a first voltage measurement circuit 13, a second voltage measurement circuit 13_a_, and a multiplexer 19.

The first voltage measurement circuit 13 includes a differential switched capacitor amplifier 17 and an AD converter 18 including a delta-sigma (ΔΣ) modulator in the downstream stage. The first voltage measurement circuit 13 is included in the analog front end 50_a_. The second voltage measurement circuit 13_a_ includes a differential switched capacitor amplifier 17_a_ and the AD converter 18_a_ including the ΔΣ modulator in the downstream stage. The second voltage measurement circuit 13_a_ is included in the analog front end 50_a_.

As illustrated in FIG. 11, the first reference resistor 12_a_, the second reference resistor 12_b_, and an anti-aliasing filters 20_a_, 20_b_, and 20 may be provided externally to the ASIC 50. However, as illustrated in FIG. 12, it may be desirable to dispose the first reference resistor 12_a_ in the ASIC 50. The first reference resistor 12_a_ may be adapted to the same ASIC 50 (corresponding to an integrated circuit) to which the first voltage measurement circuit 13 and the second voltage measurement circuit 13_a_ are adapted. By adapting the first reference resistor 12_a_ to the same ASIC 50 to which the first voltage measurement circuit 13 and the second voltage measurement circuit 13_a_ are adapted, there is no need to provide an additional reference resistor. Thus, it is possible to construct the first reference resistor 12_a_ with a smaller area.

The ASIC 50 illustrated in FIG. 12 also includes the anti-aliasing filter 20_a_. The anti-aliasing filter 20_a_ is arranged between the first reference resistor 12_a_ and the multiplexer 19, and cuts frequency components higher than the Nyquist frequency before the measurement voltage of the first reference resistor 12_a_ is provided to the AD converters 18, 18_a_.

Outside the ASIC 50, anti-aliasing filters 20_b_ and 20 are provided. The anti-aliasing filter 20_b_ is arranged between the second reference resistor 12_b_ and the multiplexer 19, and cuts frequency components higher than the Nyquist frequency before the measurement voltage of the second reference resistor 12_b_ is provided to the AD converters 18, 18_a_. The anti-aliasing filter 20 is arranged between the shunt resistor 12 and the multiplexer 19, and cuts frequency components higher than the Nyquist frequency before the measurement voltage of the shunt resistor 12 is provided to the AD converters 18, 18_a_.

The current excitation circuit 52 includes the switching power supply circuit 11 as the AC excitation circuit, and also includes the DC excitation circuit 16. In addition, in FIGS. 11 and 12, the same reference numerals are assigned to the identical parts as in the fourth embodiment, and the explanation of the identical parts is omitted. The present embodiment provides the similar advantageous effect to the preceding embodiments described above.

Seventh Embodiment

Figure 13:
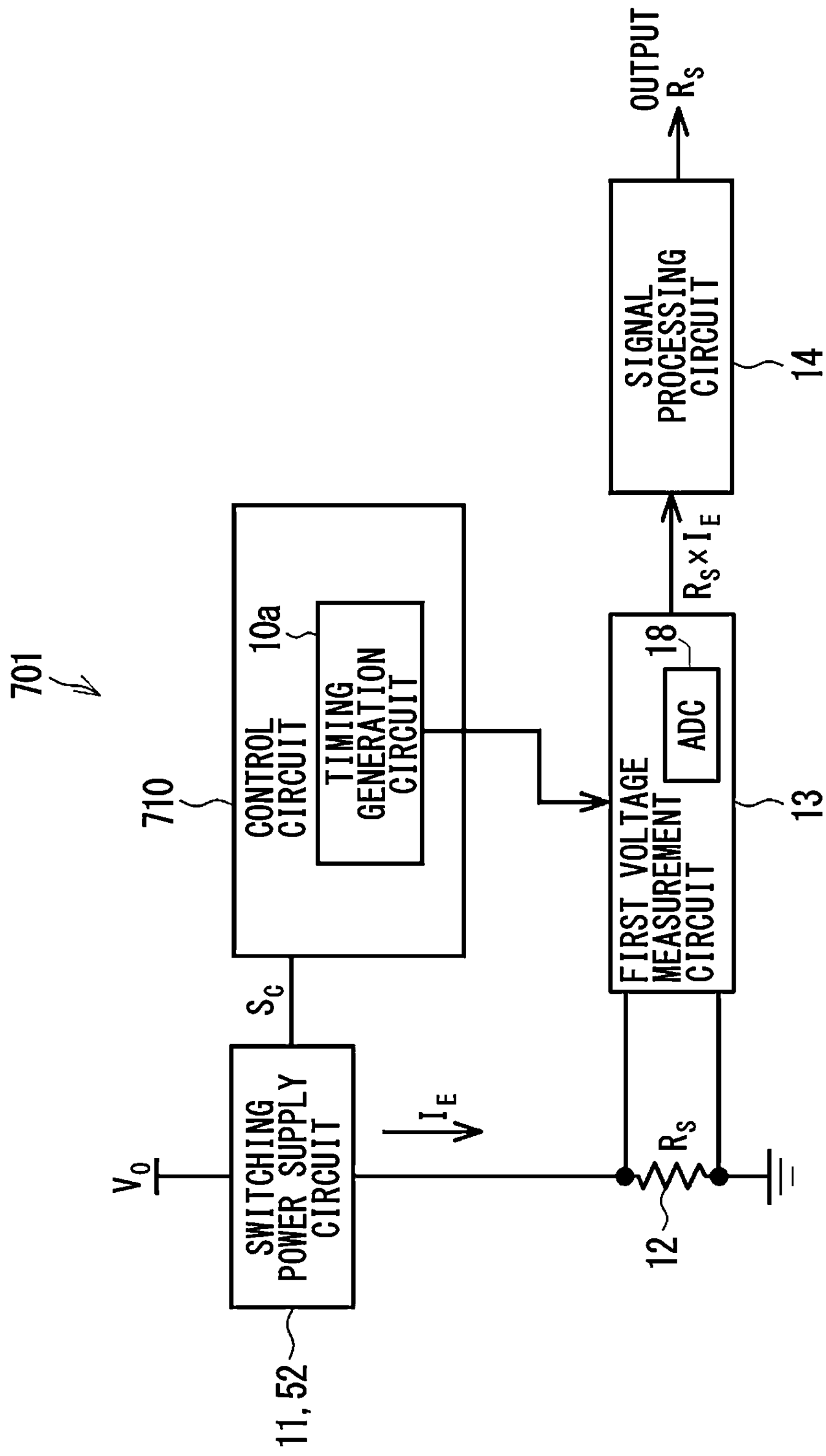
FIG. 13 is an electrical configuration diagram illustrating a shunt resistance measurement circuit according to a seventh embodiment.
Figure 14:
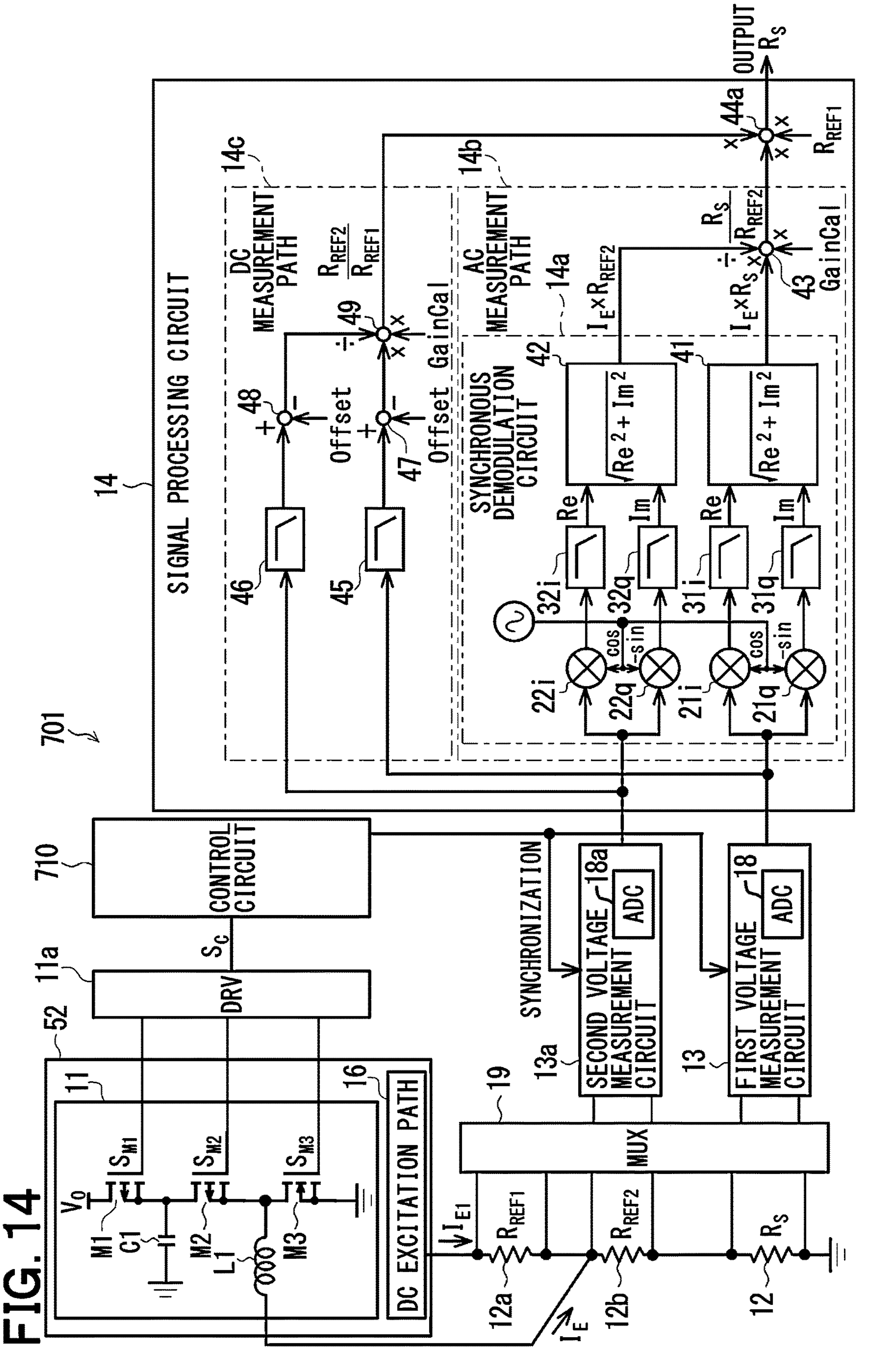
FIG. 14 is an electrical configuration diagram illustrating an example of the configuration of the shunt resistance measurement circuit according to the seventh embodiment.

The following describes a seventh embodiment with reference to FIGS. 13 and 14. As described in the first embodiment, when the frequency $f_C$ of the carrier signal $S_C$ overlaps with the frequency range in which the skin effect of the shunt resistor 12 is small, a shunt resistance measurement circuit 701 may be constructed as illustrated in FIG. 13 without providing a circuit related to the modulation signal $S_M$, such as the mixer 15.

The shunt resistance measurement circuit 701 according to the present embodiment includes a control circuit 710, the switching power supply circuit 11, a first voltage measurement circuit 13, and a signal processing circuit. The control circuit 710 outputs an AC carrier signal $S_C$. The switching power supply circuit 11 includes the switching elements M1 to M3, drives the switching elements M1 to M3 based on a signal including a carrier signal $S_C$, and outputs a power supply including an AC excitation current $I_E$. The output of the switching power supply circuit 11 is supplied to the shunt resistor 12.

The first voltage measurement circuit 13 measures the voltage across the shunt resistor 12. The signal processing circuit 14 processes the signal based on the voltage measured by the first voltage measurement circuit 13 and measures the resistance value $R_S$ of the shunt resistor 12. The other configuration is the same as that of the preceding embodiment, and hence the description will be omitted.

When setting the carrier signal $S_C$ of the shunt resistance measurement circuit 701 to lower the frequency to a level where the skin effect of shunt resistor 12 has minimal impact, the respective component values of the inductor L1 and the capacitor C1 are more likely to be larger than the typical values used in a regular operation.

In this case, while adjusting the size of the inductor L1 and capacitor C1 included in the switching power supply circuit 11, the switching elements M1 to M3 can be driven by the carrier signal $S_C$ to allow the switching power supply circuit 11 to output an AC excitation current $I_E$ at the frequency $f_C$ of the carrier signal $S_C$.

As shown in FIG. 14, as a specific example of a shunt resistance measurement circuit 701, the switching power supply circuit 11 is driven by the carrier signal $S_C$. The other configurations are similar to those of the preceding embodiments (in particular, the fourth embodiment), and therefore will not be described.

According to this embodiment, since the signal is excited by the carrier signal $S_C$ and processed, it is not necessary to generate an excitation current having the frequency of the modulation signal $S_M$, and therefore lower power consumption is possible. Since the modulation circuit (for example, the mixer 15) is not necessary, the configuration area can be reduced.

Other Embodiments

The present disclosure should not be limited to the embodiments described above, and various modifications may further be implemented without departing from the spirit of the present disclosure. For example, the following modifications or extensions can be performed. Each component is conceptual and is not limited to the above-described embodiments.

The control device such as the control circuit 10 and method described in the present disclosure may be implemented by a special purpose computer which is configured with a memory and a processor programmed to execute one or more particular functions embodied in computer programs of the memory. Alternatively, the control device described in the present disclosure and the method thereof may be realized by a dedicated computer configured as a processor with one or more dedicated hardware logic circuits. Alternatively, the control device and method described in the present disclosure may be realized by one or more dedicated computer, which is configured as a combination of a processor and a memory, which are programmed to perform one or more functions, and a processor which is configured with one or more hardware logic circuits. In addition, the computer program may be stored in a computer-readable non-transition tangible recording medium as an instruction to be executed by a computer.

Although the present disclosure has been described in accordance with the embodiments, it is understood that the present disclosure is not limited such embodiments or structures described in the embodiments. To the contrary, the present disclosure is intended to cover various modification and equivalent arrangements. Furthermore, various combination and formation, and other combination and formation including one, more than one or less than one element may be made in the present disclosure.

What is claimed is:

1. A shunt resistance measurement circuit adapted to a shunt-based current sensor configured to measure a resistance value of a shunt resistor, the shunt resistance measurement circuit comprising:

a control circuit configured to output a control signal including an AC carrier signal;

a switching power supply circuit configured to be operated by the control signal to output a power supply to the shunt resistor;

a voltage measurement circuit configured to measure a voltage across the shunt resistor;

a signal processing circuit configured to measure the resistance value of the shunt resistor by executing signal processing, based on the voltage measured by the voltage measurement circuit; and a mixer, wherein the control circuit is configured to output the control signal including the AC carrier signal and an AC modulation signal;

the mixer is configured to multiply the AC carrier signal with the AC modulation signal to acquire a modulated signal;

the switching power supply circuit includes a switching element configured to be driven by the modulated signal; and the switching power supply circuit is configured to output the power supply including an AC excitation current induced by the modulated signal.

2. The shunt resistance measurement circuit according to claim 1, wherein the voltage measurement circuit is a first voltage measurement circuit, the shunt resistance measurement circuit further comprising:

a reference resistor being connected to the shunt resistor in series, the reference resistor configured to receive the power supply from the switching power supply circuit; and a second voltage measurement circuit configured to measure a voltage across the reference resistor, wherein the signal processing circuit is configured to measure the resistance value of the shunt resistor by executing the signal processing, based on the voltage measured by the first voltage measurement circuit and the voltage measured by the second voltage measurement circuit.

3. The shunt resistance measurement circuit according to claim 2, wherein the control circuit is further configured to synchronize the switching power supply circuit's power supply output with the measurement timing of the first and second voltage measurement circuits.

4. The shunt resistance measurement circuit according to claim 3, wherein:

the first voltage measurement circuit includes an AD converter configured to measure a voltage across the shunt resistor by the AC excitation current and convert a result of the voltage measured across the shunt resistor into a digital signal;

the second voltage measurement circuit includes an AD converter configured to measure a voltage across the reference resistor by the AC excitation current and convert a result of the voltage measured across the reference resistor into a digital signal; and the signal processing circuit is configured to execute the signal processing at a same frequency as a frequency of the digital signals output by the AD converter of the first voltage measurement circuit and the AD converter of the second voltage measurement circuit for a synchronous demodulation of the digital signals at a same frequency as the frequency of the AC excitation current induced by the modulated signal.

5. The shunt resistance measurement circuit according to claim 4, wherein the signal processing circuit is configured to measure the resistance value of the shunt resistor by executing a division calculation in which a measurement result of the shunt resistor is divided by a measurement result of the reference resistor, and executing a multiplication calculation in which preliminarily stored reference resistance of the reference resistor is multiplied by a calculated result of the division calculation.

6. The shunt resistance measurement circuit according to claim 5, wherein:

the switching element included in the switching power supply circuit is one of two switching elements connected in series between a DC power supply node and a ground node; and the switching power supply circuit further includes an inductor disposed between an output node of the switching power supply circuit and an intermediate node located between the two switching elements.

7. The shunt resistance measurement circuit according to claim 6, wherein:

one of the two switching elements between the DC power supply node and another of the two switching elements is an upstream switching element; and the switching power supply circuit further includes a charge-sampling switching element connected in series between the DC power supply node and the upstream switching element, and a capacitor disposed between the ground node and an intermediate node located between the upstream switching element and the charge-sampling switching element.

8. The shunt resistance measurement circuit according to claim 4, wherein:

the reference resistor is one of reference resistors having a first reference resistor and a second reference resistor that are connected in series to the shunt resistor;

the switching power supply circuit is a first power source;

a series circuit, in which the first reference resistor, the second reference resistor and the shunt resistor are connected in series, is configured to be powered by a second power source; and the signal processing executed by the signal processing circuit includes a first measurement process in which a resistance ratio between a resistance value of the first reference resistor and a resistance value of the second reference resistor is measured, based on a voltage across the first reference resistor and a voltage the second reference resistor that are measured by the first voltage measurement circuit and the second voltage measurement circuit, respectively; and a second measurement process in which a resistance ratio between the resistance value of the second reference resistor and the resistance value of the shunt resistor is measured, based on the voltage measured across the second reference resistor and the voltage measured across the shunt resistor.

9. The shunt resistance measurement circuit according to claim 8, wherein the second power source is configured to output the AC excitation current by a linear regulator to which the AC modulation signal is provided.

10. The shunt resistance measurement circuit according to claim 9, wherein the second power source is further configured to convert a current supplied to the first reference resistor and the second reference resistor into the AC excitation current in the first measurement process.

11. The shunt resistance measurement circuit according to claim 9, wherein the signal processing circuit is configured to measure the resistance value of the shunt resistor by acquiring a first calculated result of the first measurement process in which the resistance value of the second reference resistor is divided by the resistance value of the first reference resistor, acquiring a second calculated result of the second measurement process in which the resistance value of the shunt resistor is divided by the resistance value of the second reference resistor, and multiplying the first calculated result by the second calculated result and then by a preliminarily stored reference resistance value of the first reference resistor.

12. The shunt resistance measurement circuit according to claim 11, wherein the first power source is further configured to convert a current supplied to the first reference resistor and the second reference resistor into the AC excitation current in the first measurement process.

13. The shunt resistance measurement circuit according to claim 8, wherein the first reference resistor and the first voltage measurement circuit are incorporated into a same integrated circuit.

14. The shunt resistance measurement circuit according to claim 13, wherein the first reference resistor is made of tantalum nitride, titanium nitride, or nitride.

* * * * *